(12) United States Patent
Lee et al.

(10) Patent No.: US 11,537,154 B2
(45) Date of Patent: Dec. 27, 2022

(54) MOBILE DEVICES AND METHODS CONTROLLING POWER IN MOBILE DEVICES

(71) Applicant: SAMSUNG ELECTRONICS CO., LTD., Suwon-si (KR)

(72) Inventors: Kyoungmin Lee, Yongin-si (KR); Changsoo Kim, Hwaseong-si (KR); Byungchul Jeon, Hwaseong-si (KR); Junghun Heo, Suwon-si (KR); Junho Huh, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/460,389

(22) Filed: Aug. 30, 2021

(65) Prior Publication Data

US 2022/0179437 A1 Jun. 9, 2022

(30) Foreign Application Priority Data

Dec. 9, 2020 (KR) .................. 10-2020-0171476
Feb. 24, 2021 (KR) .................. 10-2021-0024672

(51) Int. Cl.
*G05F 1/56* (2006.01)
*H02M 1/00* (2006.01)
*H02M 3/04* (2006.01)
*H05K 1/18* (2006.01)

(52) U.S. Cl.
CPC ............ *G05F 1/56* (2013.01); *H02M 1/0045* (2021.05); *H02M 3/04* (2013.01); *H05K 1/181* (2013.01)

(58) Field of Classification Search
None
See application file for complete search history.

(56) References Cited

U.S. PATENT DOCUMENTS

| 6,713,860 | B2 | 3/2004 | Li |
| 7,030,481 | B2 | 4/2006 | Chudzik et al. |
| 8,943,334 | B2 | 1/2015 | Kumar et al. |
| 9,048,112 | B2 | 6/2015 | Pan et al. |
| 9,349,692 | B2 | 5/2016 | Pan et al. |
| 9,549,461 | B2 | 1/2017 | Toyama et al. |

(Continued)

FOREIGN PATENT DOCUMENTS

| CN | 201010622316 A | 7/2012 |
| CN | 201611151393 A | 8/2017 |

(Continued)

*Primary Examiner* — Jeffery S Zweizig
(74) *Attorney, Agent, or Firm* — Volentine, Whitt & Francos, PLLC

(57) ABSTRACT

A mobile device includes; a PCB including a first side and a second side, a PMIC generating power supply voltages and mounted on the second side of the PCB, a package substrate mounted on the first side of PCB using first interconnects, an IC mounted on the first side of the package substrate, LDO regulators mounted on the second side of the package substrate and disposed between the first interconnects, and high density capacitors disposed between each of the LDO regulators and the second side of the package substrate, wherein the PCB includes first electrical paths connecting the PMIC to the LDO regulators, and the package substrate includes second electrical paths connecting the LDO regulators to the IC.

20 Claims, 18 Drawing Sheets

(56) References Cited

U.S. PATENT DOCUMENTS

| | | |
|---|---|---|
| 9,595,526 B2 | 3/2017 | Zerbe et al. |
| 9,839,127 B2 | 12/2017 | Kwon et al. |
| 9,893,042 B2 | 2/2018 | Yu et al. |
| 9,915,962 B2 * | 3/2018 | Lee .................. G05F 1/575 |
| 9,933,801 B1 | 4/2018 | Guan et al. |
| 10,056,384 B2 | 8/2018 | Zerbe et al. |
| 10,114,399 B2 | 10/2018 | Trivedi et al. |
| 10,411,012 B2 | 9/2019 | Zerbe et al. |
| 10,658,335 B2 | 5/2020 | Gu et al. |
| 2018/0175002 A1 | 6/2018 | Loo et al. |
| 2020/0027881 A1 | 1/2020 | Zerbe et al. |

FOREIGN PATENT DOCUMENTS

| | | |
|---|---|---|
| KR | 20150098190 A | 8/2015 |
| KR | 1614132 B1 | 4/2016 |
| KR | 20160046521 A | 4/2016 |
| KR | 1819838 B1 | 1/2018 |

\* cited by examiner

MOBILE DEVICES AND METHODS CONTROLLING POWER IN MOBILE DEVICES

CROSS-REFERENCE TO RELATED APPLICATIONS

This U.S. patent application claims priority under 35 USC § 119 to Korean Patent Application No. 10-2020-0171476 filed on Dec. 9, 2020, and Korean Patent Application No. 10-2021-0024672 filed on Feb. 24, 2021, the collective subject matter of which is hereby incorporated by reference.

BACKGROUND

The inventive concept relates generally to semiconductor devices, and more particularly, to mobile devices and methods of controlling power in mobile devices.

The term system-on-chip (SoC) is used to describe devices in which principal sub-systems of a computational or digital device (e.g., a mobile device, computer or electronic system) are provided as an integrated circuit (IC) on a single die. That is, a SoC may be fabricated such that a single chip includes principal subsystems of a computational or digital device. In this regard, a SoC may operate in response to one or more power signals generated under the control of a power management integrated circuit (or PMIC), wherein the power signals may be provided via a so-called power rail.

However, given existing demands for smaller, mobile consumer devices, the size of components associated with the provision of power signals within computational and digital devices has come into issue. Therefore, it has become advisable to reduce the overall size of the power rail, as well as the number of passive components associated with the provision of power signals in certain mobile devices.

SUMMARY

Embodiments of the inventive concept provide mobile devices characterized by power rails of reduced size (e.g., a reduced length), as well as and a reduced number of passive components.

Embodiments of the inventive concept provide methods of controlling power in mobile devices including power rails of reduced size, as well as a reduced number of passive components.

According to some embodiments, a mobile device may include; a printed circuit board (PCB) including a first side and an opposing second side, at least one power management integrated circuit (PMIC) mounted on the second side of the PCB, wherein the PMIC is configured to generate power supply voltages in response to a battery voltage, a package substrate mounted on the first side of PCB using first interconnects, wherein the package substrate includes a first side and an opposing second side, an integrated circuit (IC) mounted on the first side of the package substrate, and low drop-out (LDO) regulators mounted on the second side of the package substrate between the first interconnects, wherein the PCB includes first electrical paths connecting the at least on PMIC to the LDO regulators and the package substrate includes second electrical paths connecting the LDO regulators to the IC.

According to some embodiments, a method of controlling power in a mobile device may include; generating power supply voltages using a power management integrated circuit (PMIC), wherein the PMIC is mounted on a second side of a printed circuit board (PCB) including the second side and an opposing first side, providing the power supply voltages to low drop-out (LDO) regulators mounted on a second side of a package substrate mounted on the first side of the PCB using first interconnects, the package substrate having a first side and the second side opposing the first side, wherein the LDO regulators are disposed between the first interconnects, generating output voltages in the LDO regulators in response to the power supply voltages, and providing one of the output voltages to a respective one of power domains of an integrated circuit (IC) mounted on the first side of the package substrate using second interconnects.

According to some embodiments, a mobile device may include; a printed circuit board (PCB) including a first side and an opposing second side, a power management integrated circuit (PMIC) mounted on the second side of the PCB, wherein the PMIC generates power supply voltages in response to a battery voltage, a package substrate mounted on the first side of PCB using first interconnects, wherein the package substrate includes a first side and an opposing second side, an integrated circuit (IC) mounted on the first side of the package substrate, low drop-out (LDO) regulators mounted on the second side of the package substrate, wherein the LDO regulators are disposed between the first interconnects, and high density capacitors disposed between each of the LDO regulators and the second side of the package substrate, wherein the PCB includes first electrical paths connecting the PMIC to the LDO regulators, and the package substrate includes second electrical paths connecting the LDO regulators to the IC.

BRIEF DESCRIPTION OF THE DRAWINGS

The above and other features of the inventive concept may be better understood upon consideration of the following detailed description, together with the accompanying drawings, in which;

FIG. 4 is a block diagram further illustrating power domains for the IC die of the mobile device of FIG. 3;

DETAILED DESCRIPTION

Throughout the written description and drawings, like reference numbers and labels are used to denote like, or similar, elements, components, features and/or method steps.

FIG. (FIG.) 1 is a block diagram illustrating a mobile device 10 according to embodiments of the inventive concept.

Figure 1:
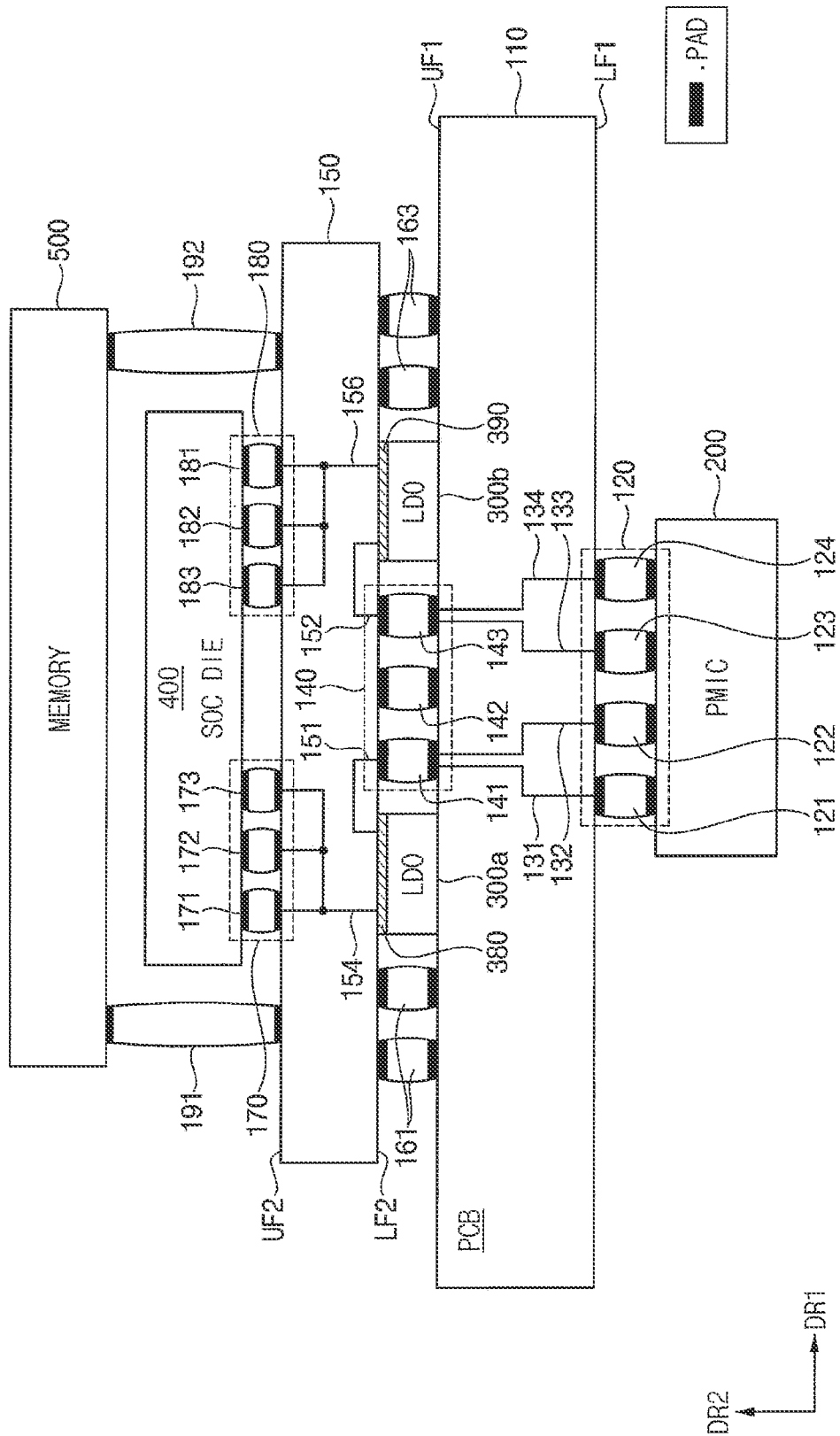
FIGS. 1, 2A and 2B are respective cross-sectional diagrams illustrating various mobile devices 10, 10a and 10b according to embodiments of the inventive concept.

Referring to FIG. 1, the mobile device 10 may be variously implemented as a computational device, such as a mobile or portable device, a mobile phone, a smart phone, a tablet computer, a laptop computer, a personal digital assistants (PDA), an enterprise digital assistant (EDA), a portable multimedia player (PMP), a digital camera, a portable game console, a music player, a camcorder, a video player, a navigation device, a wearable device, an internet of things (IoT) device, an internet of everything (IoE) device, an e-book, a virtual reality (VR) device, an augmented reality (AR) device, a robotic device, etc.

The mobile device 10 may include a printed circuit board (PCB) 110 mounting various elements and components. In this regard, each of the terms "mounted", "mounted on" and "mounting" refer to one or more techniques by which an element or component may be mechanically attached and/or electrically connected to another element or component.

In this regard, the PCB 110 (e.g., a circuit board or a substrate) may be understood as including a first side UF1 (e.g., an upper side or a front side) and an opposing second side LF1 (e.g., a lower side or a rear side). Various elements and components may be mounted on one or both of the first side UF1 and the second side LF1. Here, the mounted components may include at least one power management integrated circuit (PMIC), as well as various passive components, and/or low drop-out (LDO) regulators.

The PCB 110 may include electrical paths (e.g., electrically conductive patterns or traces) variously connecting the mounted elements and components on the first side UF1 of the PCB 110 and/or the mounted elements and components on the second side LF1 of the PCB 110. In this regard, a number of power signals (e.g., one or more power voltages and ground) may be transmitted via the electrical paths.

In some embodiments, the PCB 110 may include one or more insulating layer(s) (e.g., dielectric material layers), and one or more electrically conductive layer(s) (e.g., metal wiring layers) separated by the insulating layer(s). The PCB 110 may also include conductive vias extending through one or more of the insulating layer(s) to variously connect two or more of the conductive layer(s).

In the illustrated example of FIG. 1, the mobile device 10 includes a PMIC 200 (e.g., a die including circuitry capable of performing the various power generation and/or management functions), a package substrate 150, LDO regulators 300a and 300b, an integrated circuit (IC) 400 (e.g., a die, such as a SoC die) and a memory 500 (e.g., one or more memory die(s)).

The package substrate 150 may be mounted on the first side UF1 of PCB 110 by first interconnects 140, 161 and 163, and may also include a first side UF2 and an opposing second side LF2. Here, each of the first interconnects 140, 161 and 163 (as well as other interconnects described herein) may include at least one of an electrically conductive pad, land, pin, bump, and ball. In this regard, the pad, land and pin may include one or more metal(s) such as copper, and the bump or ball may include one or more conductive materials such as solder. In some embodiments, an "interconnect" may include a ball and pads mounted on opposing sides of the ball.

The LDO regulators 300a and 300b may be mounted on the second side LF2 of the package substrate LF2 among (or proximate to) the first interconnects 140, 161 and 163. High density capacitors 380 and 390 may be respectively disposed between the second side LF2 of the package substrate 150 and the LDO regulators 300a and 300b. In this regard, the high density capacitors 380 and 390 may be referred to as landside capacitors, since the high density capacitors 380 and 390 are mounted on the second side (or landside) LF2 of the package substrate 150.

In some embodiments, the LDO regulator 300a (or LDO regulator 300b) and the high density capacitor 380 (or high density capacitor 390) may be fabricated using the same process. Alternately or additionally, the LDO regulator 300a (or LDO regulator 300b) and the high density capacitor 380 (or high density capacitor 390) may be sequentially stacked.

The PMIC 200 may be mounted on the second side LF1 of the PCB 110 using second interconnects 120.

The IC 400 may be mounted on the first side UF2 of the package substrate 150 using third interconnects 170 and 180. Here, the IC 400 may include at least one of a microprocessor, a graphics processor, a signal processor, a network processor, a chipset, an application processor, a modem IC, a radio frequency (RF) IC, a flash memory and a system on chip (SoC).

The memory 500 may be mounted on the first side UF2 of the package substrate 150 using fourth interconnects 191 and 192. Thus, the memory 500 may overlie, at least in part, the IC 400. In some embodiments, the memory 500 may include at least one of a dynamic random access memory (RAM) (DRAM), a static RAM (SRAM), a flash memory device (e.g., a NAND flash memory), etc. In some embodiments, the memory 500 may include a memory controller in addition to one or more memory dies.

In some embodiments, the first interconnects 140 may include first balls 141, 142 and 143; the second interconnects 120 may include second balls 121, 122, 123 and 124; the third interconnects 170 may include balls 171, 172, 173; and, the third interconnects 180 may include balls 181, 182 and 183.

The PCB 110 may include first electrical paths 131, 132, 133 and 134 variously connecting the PMIC 140 to the LDO regulators 300a and 300b through the second interconnects 120 and the first interconnects 140. The package substrate 150 may include second electrical paths 151, 152, 154 and 156 connecting the LDO regulators 300a and 300b to the IC 400 through the first interconnects 140 and the third interconnects 170 and 180.

Second electrical paths 151 and 152 among the second electrical paths 151, 152, 154 and 156 may be deemed first branch paths, since the electrical paths 151 and 152 connect the balls 141 and 143 of the first interconnects 140 to the LDO regulators 300a and 300b. Second electrical paths 154 and 156 among the second electrical paths 151, 152, 154 and 156 may be deemed second branch paths, since the electrical paths 154 and 156 connect the LDO regulators 300a and 300b to the third interconnects 170 and 180.

The PMIC 200 may be used to generate one or more power supply voltages, and provide these power supply voltages to the LDO regulator 300a through the second balls 121 and 122, the ball 141 and the electrical path 151. The PMIC 200 may provide one or more power supply voltages to the LDO regulator 300b through the second balls 123 and 123, the ball 143 and the electrical path 152.

The LDO regulator 300a may generate an output voltage in response to (or based on) the received power supply voltage, and may provide the output voltage to a corresponding power domain of the IC 400 through the high density capacitor 380, the electrical path 154 and the balls 171, 172 and 173. The LDO regulator 300b may generate an output voltage in response to (or based on) the received power supply voltage and may provide the output voltage to a corresponding power domain of the IC 400 through the high density capacitor 390, the electrical path 156 and the balls 181, 182 and 183.

Each of the PCB 110 and the package substrate 150 may have a "length" (e.g., measured in a first direction DR1) and a "thickness" (e.g., measured in a second direction DR2). In this regard, the PMIC 200, PCB 110, LDO regulators 300a and the 300b, IC 400 and memory 500 may be understood as being stacked in the second direction DR2.

Figure 2A:
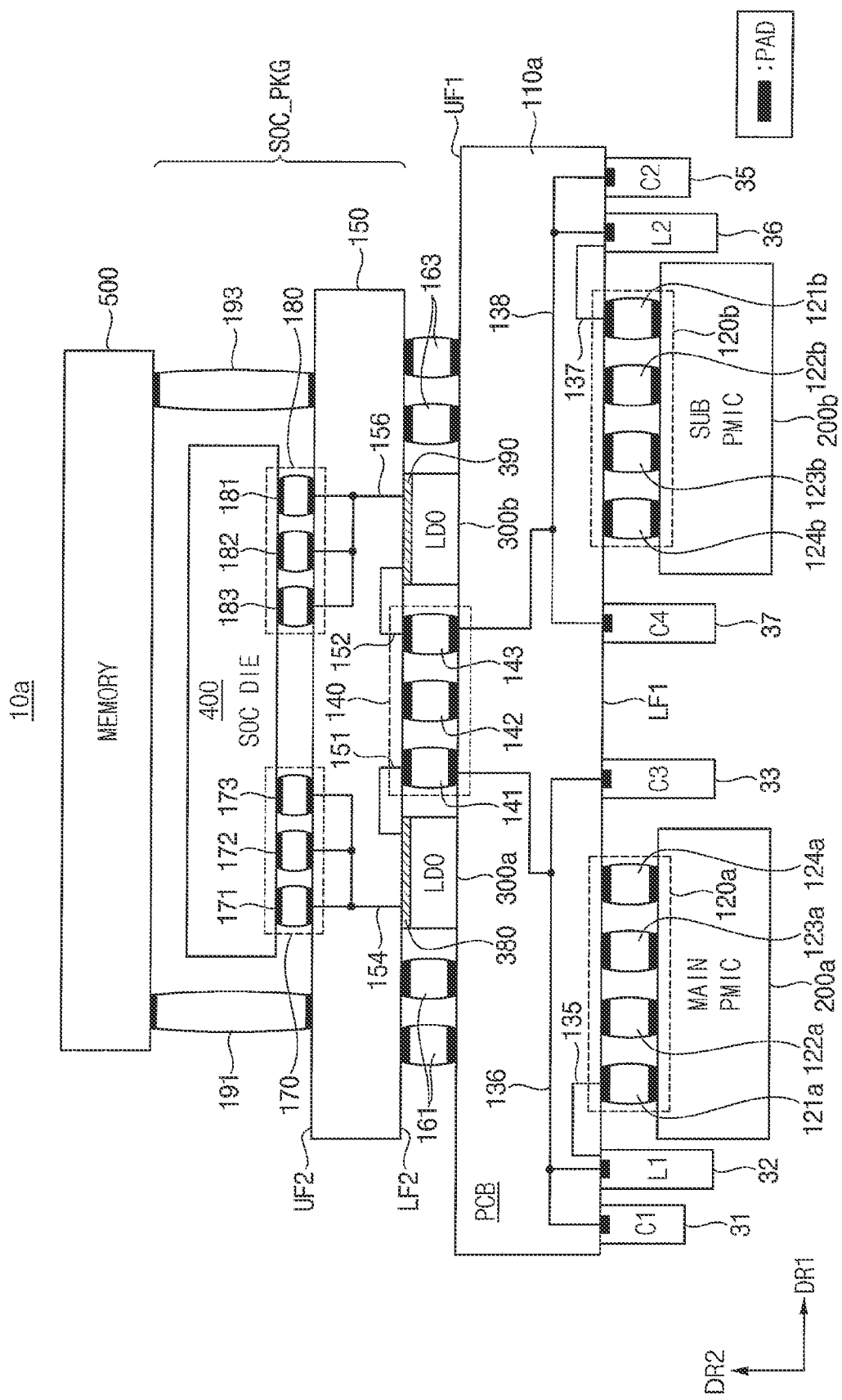

FIG. 2A is a block diagram illustrating a mobile device 10a according to embodiments of the inventive concept.

Referring to FIG. 2, the mobile device 10a may include a PCB 110a, a first PMIC 200a (e.g., a main PMIC), a second PMIC 200b (e.g., a sub PMIC), passive components 31, 32, 33, 35, 36 and 37, the package substrate 150, the LDO regulators 300a and 300b, the IC 400 and the memory 500. The mobile device 10a may further include the high density capacitors 380 and 390 respectively between the second side LF2 of the package substrate 150 and the LDO regulators 300a and 300b.

Here, the PCB 110a may be substantially the same as the PCB 110 described in relation to FIG. 1.

In some embodiments, the first PMIC 200a and the second PMIC 200b may be spaced apart in the first direction DR1.

The respective passive components 31, 32, 33, 35, 36 and 37 may be variously mounted on the second side LF1 of the PCB 110a using pads and/or lands. The passive components 31, 32, 33, 35, 36 and 37 may include, for example: a first capacitor (C1) 31 and a first inductor (L1) associated with an output of the first PMIC 200a, a third capacitor (C3) 33 associated with an input of the LDO regulator 300a, as well as a second capacitor (C2) 35 and a second inductor (L2) associated with an output of the second PMIC 200b, and a fourth capacitor (C4) 37 associated with an input of the LDO regulator 300b.

The first PMIC 200a may be mounted on the second side LF1 of the PCB 110a using second interconnects 120a. Here, the second interconnects 120a may include balls 121a, 122a, 123a and 124a. The ball 121a may be coupled to the first PMIC 200a and the first inductor 32 through a first electrical path 135. Therefore, a power supply voltage generated by the first PMIC 200a may be provided to the LDO regulator 300a through the first capacitor 31, the first inductor 32, the capacitor 33, the first electrical paths 135 and 136 and the ball 141.

The second PMIC 200b may be mounted on the second side LF1 of the PCB 110a by second interconnects 120b. Here, the second interconnects 120b may include balls 121b, 122b, 123b and 124b. The ball 121b may be coupled to the second PMIC 200b and the second inductor 36 through a second electrical path 137. Therefore, a power supply voltage generated by the second PMIC 200b may be provided to the LDO regulator 300b through the second capacitor 35, the second inductor 36, the capacitor 37, the second electrical paths 137 and 138 and the ball 143.

The LDO regulator 300a may generate an output voltage in response to (or based on) the received power supply voltage, and may provide the generated output voltage to a corresponding power domain of the IC 400 through the high density capacitor 380, the electrical path 154 and the balls 171, 172 and 173. The high density capacitor 380 may operate as an output capacitor of the LDO regulator 300a.

The LDO regulator 300b may generate an output voltage in response to (or based on) the received power supply voltage, and may provide the generated output voltage to a corresponding power domain of the IC 400 through the high density capacitor 390, the electrical path 156 and the balls 181, 182 and 183. The high density capacitor 390 may operate as an output capacitor of the LDO regulator 300b.

Since the LDO regulators 300a and 300b are mounted on the second side LF2 of the package substrate 150 and are respectively disposed proximate to (e.g. directly adjacent to) the high density capacitors 380 and 390, instead of the LDO regulators 300a and 300b being included in the first PMIC 200a and the second PMIC 200b, certain output capacitors and/or decoupling capacitors conventionally associated with the LDO regulators 300a and 300b (e.g., those conventionally mounted on the second side LF1 of the PCB 110a) may be omitted.

Alternately or additionally, since the LDO regulators 300a and 300b are mounted on the second side LF2 of the package substrate 150, instead of the LDO regulators 300a and 300b being included in the first PMIC 200a and the second PMIC 200b, the number of electrical paths (e.g., power rails) needed to transfer power supply voltages to the LDO regulators 300a and 300b from the first PMIC 200a and the second PMIC 200 may be reduced in relation to conventional designs.

Alternately or additionally, since the LDO regulators 300a and 300b are mounted on the second side LF2 of the package substrate 150 instead of the LDO regulators 300a and 300b being included in the first PMIC 200a and the second PMIC 200b, each of the LDO regulators 300a and 300b may provide an output voltage to a corresponding power domain through a reduced number of balls 171, 172, 173, 181, 182 and 183, as compared with conventional designs.

In some embodiments consistent with the illustrated example of FIG. 2A, the LDO regulators 300a and 300b, the package substrate 150 and the IC 400 may be combined in an IC package (e.g., a SoC package or SOC_PKG).

Figure 2B:
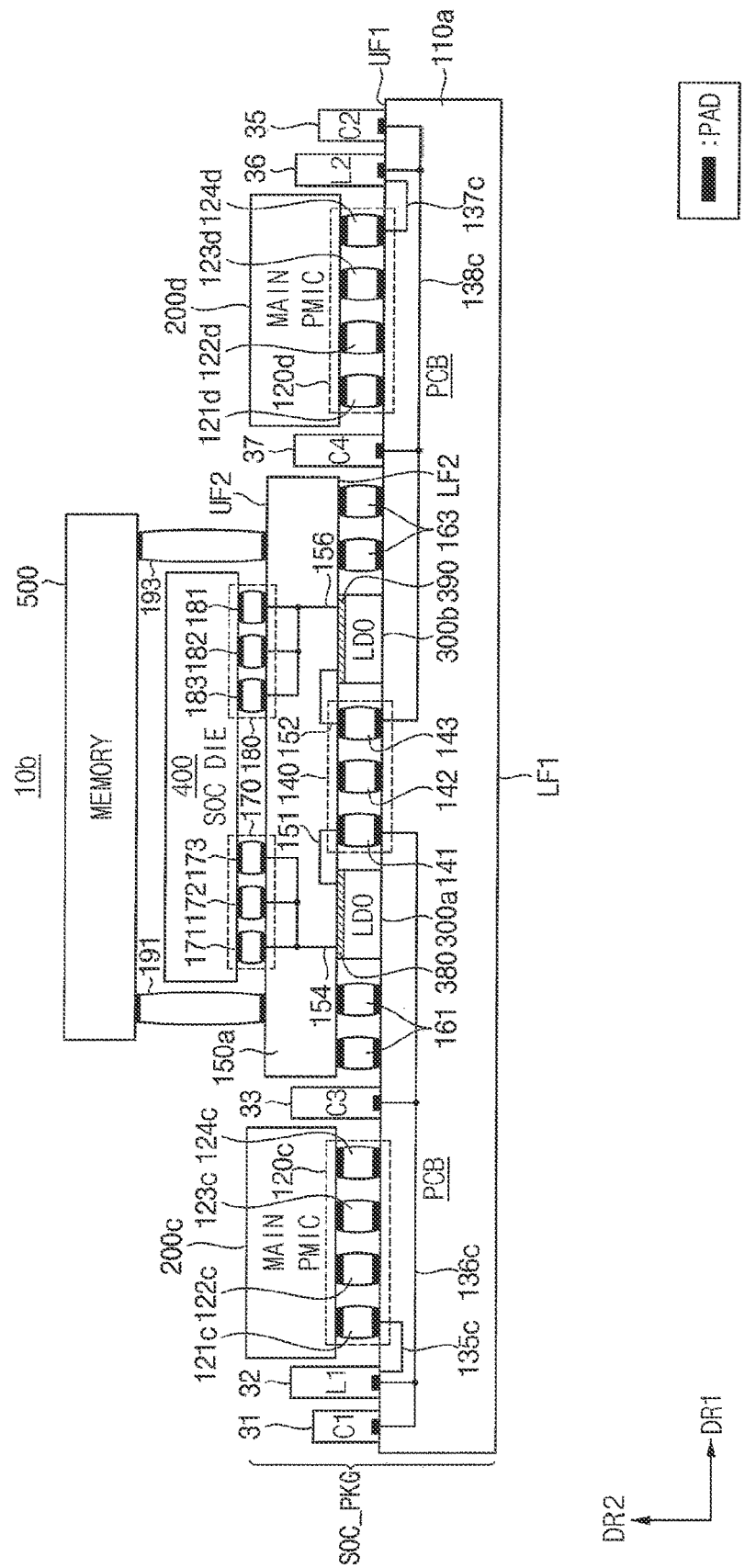

FIG. 2B is a block diagram illustrating a mobile device 10b according to embodiments of the inventive concept.

Referring to FIG. 2, the mobile device 10b may include a PCB 110b, a first PMIC 200c, a second PMIC 200c, passive components 31, 32, 33, 35, 36 and 37, a package substrate 150a, LDO regulators 300a and 300b, the IC die 400 and the memory 500. The mobile device 10b may further include high density capacitors 380 and 390 respectively disposed between the second side LF2 of the package substrate 150 and the LDO regulators 300a and 300b.

Here, the mobile device 10b of FIG. 2B differs from the mobile device 10a of FIG. 2A in that the first PMIC 200c, the second PMIC 200d, as well as the passive components 31, 32, 33, 35, 36 and 37 are mounted on the first side UF1 of the PCB 110a, together with the LDO regulators 300a and 300b. In some embodiments, the first PMIC 200c and the second PMIC 200c may be spaced apart in the first direction DR1.

The passive components 31, 32, 33, 35, 36 and 37 may be mounted on the first side UF1 of the PCB 110a using pads and/or lands. The passive components 31, 32, 33, 35, 36 and 37 may include a first capacitor (C1) 31, a first inductor (L1) associated with an output of the first PMIC 200c and a capacitor (C3) 33 associated with an input of the LDO regulator 300a, a second capacitor (C2) 35, a second inductor (L2) associated with an output of the second PMIC 200d and a capacitor (C4) 37 associated with an input of the LDO regulator 300b.

The first PMIC 200c may be mounted on the second side LF1 of the PCB 110a using second interconnects 120c. Here, the second interconnects 120c may include balls 121c, 122c, 123c and 124c. The ball 121c may be coupled to the first PMIC 200c and the first inductor 32 through a first electrical path 135c. Therefore, a power supply voltage generated by the first PMIC 200c may be provided to the LDO regulator 300a through the first capacitor 31, the first inductor 32, the capacitor 33, the first electrical paths 135c and 136c and the ball 141.

The second PMIC 200d may be mounted on the second side LF1 of the PCB 110a using second interconnects 120d. Here, second interconnects 120d may include balls 121d, 122d, 123d and 124d. The ball 121d may be coupled to the second PMIC 200d and the second inductor 36 through a second electrical path 137c. Therefore, a power supply voltage generated by the second PMIC 200d may be provided to the LDO regulator 300b through the second capacitor 35, the second inductor 36, the capacitor 37, the second electrical paths 137c and 138c and the ball 143.

In the illustrated example of FIG. 2B, the package substrate 150 and the IC 400 may combined in an IC package (e.g., a SoC package or SOC_PKG).

Figure 3:
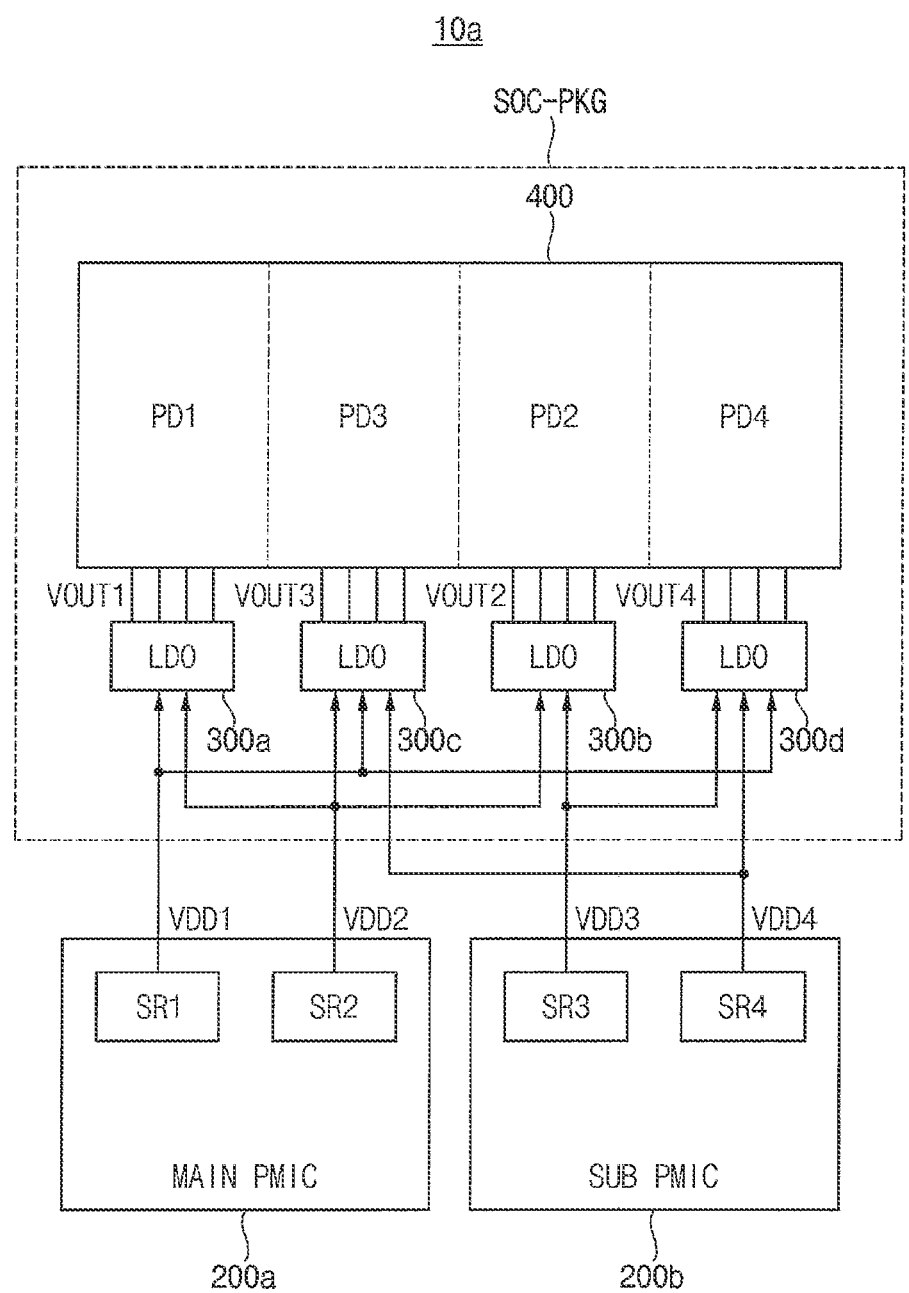
FIG. 3 is a block diagram further illustrating in relevant portion the mobile device 10a of FIG. 2A.

FIG. 3 is a block diagram further illustrating relevant portions (e.g., the IC package SOC_PKG, the first PMIC 200a and the second PMIC 200b) of the mobile device 10a of FIG. 2A.

Referring to FIG. 3, the IC package SOC_PKG may include the IC 400 and LDO regulators 300a, 300c, 300d and 300d. The IC 400 may be divided (physically and/or logically) into power domains PD1, PD3, PD2 and PD4, wherein each of the power domains PD1, PD3, PD2 and PD4 may include one or more functional block(s). In some embodiments, each of the LDO regulators 300a, 300c, 300d and 300d may correspond to respective one of the power domains PD1, PD3, PD2 and PD4.

Further, the first PMIC 200a may include sub regulators SR1 and SR2, and the second PMIC 200b may include sub regulators SR3 and SR4. In some embodiments, each of the sub regulators SR1, SR2, SR3 and SR4 may be a DC-DC converter or a buck converter.

Extending this working assumption, each of the DC-DC converters SR1, SR2, SR3 and SR4 may be used to generate at least one of power supply voltages VDD1, VDD2, VDD3 and VDD4 (e.g., from a battery voltage). Thus, in some embodiments, the DC-DC converter SR1 may provide power supply voltage VDD1 to the LDO regulators 300a, 300c and 300d, the DC-DC converter SR2 may provide power supply voltage VDD2 to the LDO regulators 300a, 300c and 300b, the DC-DC converter SR3 may provide power supply voltage VDD3 to the LDO regulators 300b and 300d, and the DC-DC converter SR4 may provide power supply voltage VDD4 to the LDO regulators 300c and 300d.

In this regard, the DC-DC converters SR1 and SR2 may be referred to as a first group of DC-DC converters that generate power supply voltages VDD1 and VDD2 among power supply voltages VDD1, VDD2, VDD3 and VDD4, and the DC-DC converters SR3 and SR4 may be referred to as a second group of DC-DC that generate power supply voltages VDD3 and VDD4 among the power supply voltages VDD1, VDD2, VDD3 and VDD4.

The LDO regulator 300a may generate a first output voltage VOUT1 in response to the power supply voltages VDD1 and VDD2, and may provide the first output voltage VOUT1 to the first power domain PD1. The LDO regulator 300b may generate a second output voltage VOUT2 in response to the power supply voltages VDD1, VDD2 and VDD3 and may provide the second output voltage VOUT2 to the second power domain PD2. The LDO regulator 300c may generate a third output voltage VOUT3 in response to the power supply voltages VDD2 and VDD3 and may provide the third output voltage VOUT3 to the third power domain PD3, and the LDO regulator 300d may generate a fourth output voltage VOUT4 in response to the power supply voltages VDD1, VDD3 and VDD4 and may provide the fourth output voltage VOUT4 to the fourth power domain PD4.

The overall length of power rails used to transfer the first, second, third and fourth output voltages VOUT1, VOUT2, VOUT3 and VPUT4 may be reduced by arranging each of the regulators 300a, 300c, 300d and 300d corresponding to respective power domains PD1, PD3, PD2 and PD4 adjacent to respective power domains PD1, PD2, PD3 and PD4.

Figure 4:
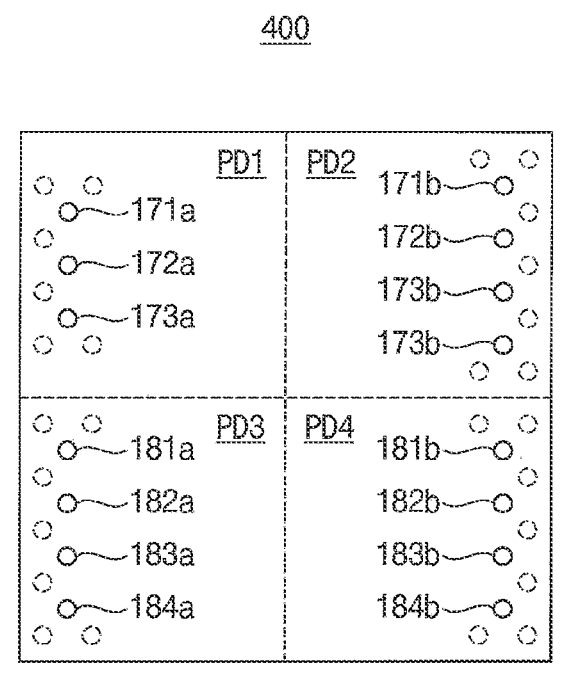

FIG. 4 is a block diagram illustrating exemplary power domains for the IC 400 of the mobile device 10a of FIG. 3.

Referring to FIG. 4, the IC 400 may be divided into power domains PD1, PD3, PD2 and PD4, wherein each of the power domains PD1, PD3, PD2 and PD4 may include at least one functional block.

Thus, a first function block of a first power domain PD1 may receive the first output voltage VOUT1 from the LDO regulator 300a of FIG. 3 through the balls 171a, 172a and 173a and may operate in response to the first output voltage VOUT1. A second function block of a second power domain PD2 may receive the second output voltage VOUT2 from the LDO regulator 300b in FIG. 3 through the balls 171b, 172b and 173b and may operate in response to the second output voltage VOUT1. A third function block of a third power domain PD3 may receive the third output voltage VOUT3 from the LDO regulator 300c in FIG. 3 through the balls 181a, 182a, 183a and 184a and may operate in response to the third output voltage VOUT3. A fourth function block of a fourth power domain PD4 may receive the fourth output voltage VOUT4 from the LDO regulator 300d in FIG. 3 through the balls 181b, 182b, 183b and 184b and may operate in response to the fourth output voltage VOUT.

In FIG. 4, the dashed-line circles indicates balls which are used to respectively transfer output voltages provided by the LDO regulators 300a, 300b, 300c and 300d to the power domains PD1, PD2, PD3 and PD4 in conventional designs wherein the LDO regulators 300a, 300b, 300c and 300d are included in the first PMIC 200a and the second PMIC 200b.

In contrast, the solid-line circles indicates balls which are used to respectively transfer output voltages provided by the LDO regulators 300a, 300b, 300c and 300d to the power domains PD1, PD2, PD3 and PD4 in designs according to embodiments of the inventive concept wherein regulators 300a, 300c, 300d and 300d corresponding to respective power domains PD1, PD3, PD2 and PD4 is physically arranged adjacent to respective power domains PD1, PD2, PD3 and PD4, as illustrated, for example, in FIG. 3. The resulting reduction in the number of balls used to transfer output voltages provided by the LDO regulators 300a, 300b, 300c and 300d to the power domains PD1, PD2, PD3 and PD4 is remarkable.

Figure 5:
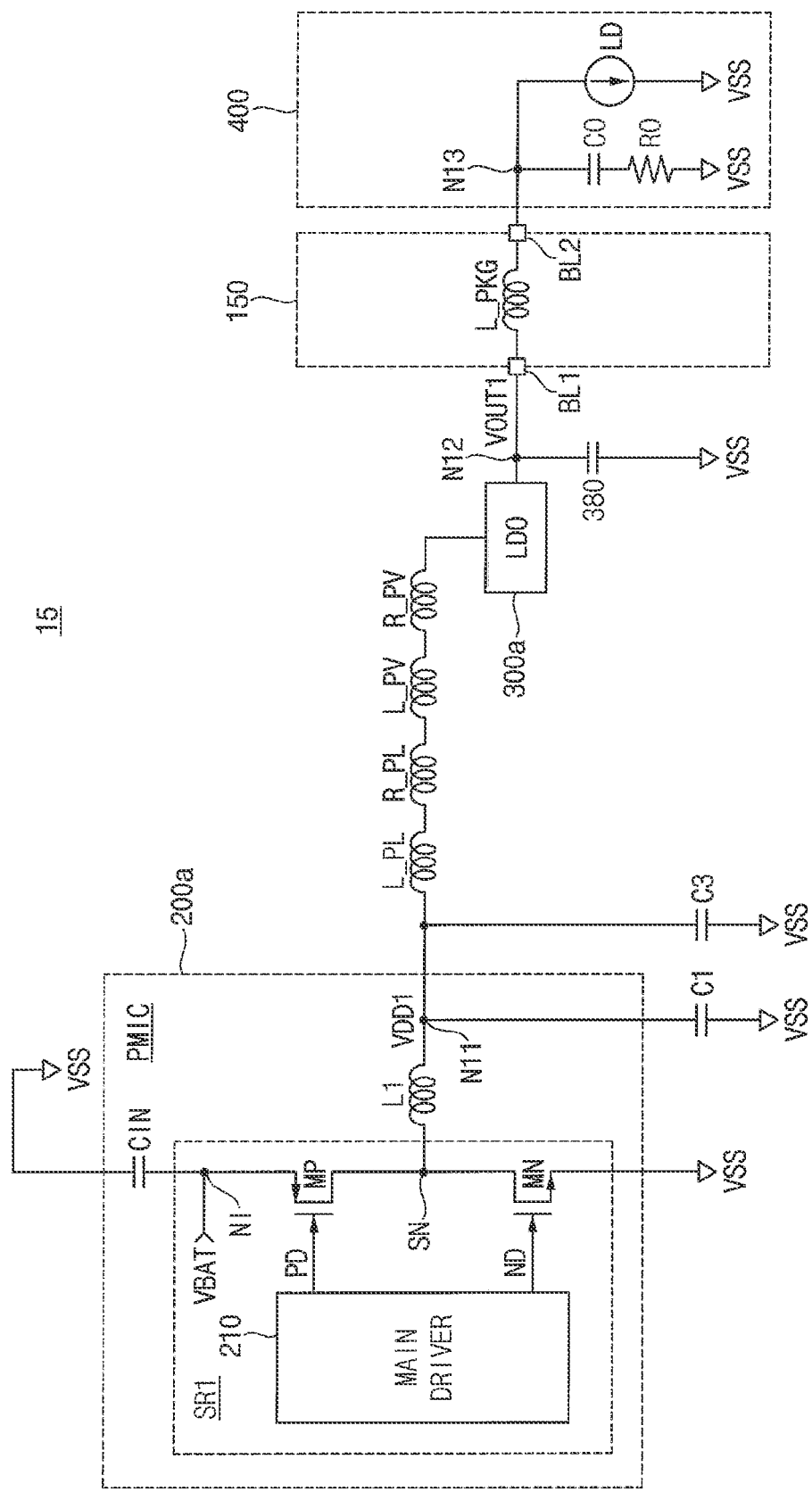
FIG. 5 is an equivalent circuit diagram of the mobile device of FIG. 2A.

FIG. 5 is an equivalent circuit diagram 15 for the mobile device 10a of FIG. 2A.

Here, for the sake of illustrative clarity only the DC-DC converter SR1 of the first PMIC 200a is illustrated in relation to a function block associated with a power domains of the IC 400 and a path from the DC-DC converter SR1 to the function block.

Referring to FIGS. 2A and 5, the DC-DC converter SR1 may include a driver 210, a first power switch MP and a second power switch MN.

The first power switch MP may be connected between an input node NI and a switching node SN. The first power switch MP may include a P-channel metal oxide (PMOS) transistor which has a source coupled to the input node NI, a gate receiving a first driving control signal PD and a drain coupled to the switching node SN. The second power switch MN may be connected between the switching node SN and a ground voltage VSS. The second power switch MP may include an N-channel metal oxide (NMOS) transistor which has a drain coupled to the switching node SN, a gate receiving a second driving control signal ND and a source coupled to the ground voltage VSS.

An input capacitor CIN may be coupled between the input node NI and the ground voltage VSS and the input capacitor CIN may be implemented as a passive component mounted on the second side LF1 of the PCB 110.

A first inductor L1 may be coupled between the switching node SN and a first node N11 and a first capacitor C1 may be coupled between the first node N11 and the ground voltage VSS. The first inductor L1 may be implemented as the passive component 32 in FIG. 2A and the first capacitor C1 may be implemented as the passive component 31 in FIG. 2A. The first power supply voltage VDD1 may be provided at the first node N11.

A capacitor C3 may be coupled in parallel with the capacitor C1 between the first node N11 and the ground voltage VSS. An inductor L_PL, a resistor R_PL, an inductor L_PV and a resistor R_PV may be connected in series between the first node N11 and the LDO regulator 300a. The inductor L_PL represents an equivalent inductor of the PCB 110a in the first direction DR1, the resistor R_PL represents an equivalent resistor of the PCB 110a in the first direction DR1, the inductor L_PV represents an equivalent inductor of the PCB 110a in the second direction DR2 and the resistor R_PV represents an equivalent resistor of the PCB 110a in the second direction DR2.

The LDO regulator 300a may provide the first output voltage VOUT1 at a second node N12 and the high density 380 may be coupled between the second node N12 and the ground voltage VSS. The package substrate 150 may be modeled as an inductor L_PKG, may be connected to the LDO regulator 300 through a ball BL1 and may be connected to the IC 400 through a ball BL2.

The function block of the IC 400 may be modeled as a load LD, an output capacitor CO and an output resistor RO. The load LD may be coupled between a third node N13 connected to the ball BL2 and the ground voltage VSS and the output capacitor CO and the output resistor RO may be connected in series between the third node N13 and the ground voltage VSS. The output capacitor CO and the output resistor RO may be connected in parallel with the load LD.

When the LDO regulator 300a is included in the first PMIC 200a, a capacitor associated with an input of the LDO regulator 300a is to be further included between the first node N11 and the ground voltage VSS, and a capacitor and a decoupling capacitor are to be further included in the equivalent circuit 15.

Since the LDO regulator 300a is attached in the second side LF2 of the package substrate 150 in the equivalent circuit 15, the number of the passive components may be reduced.

Figure 6:
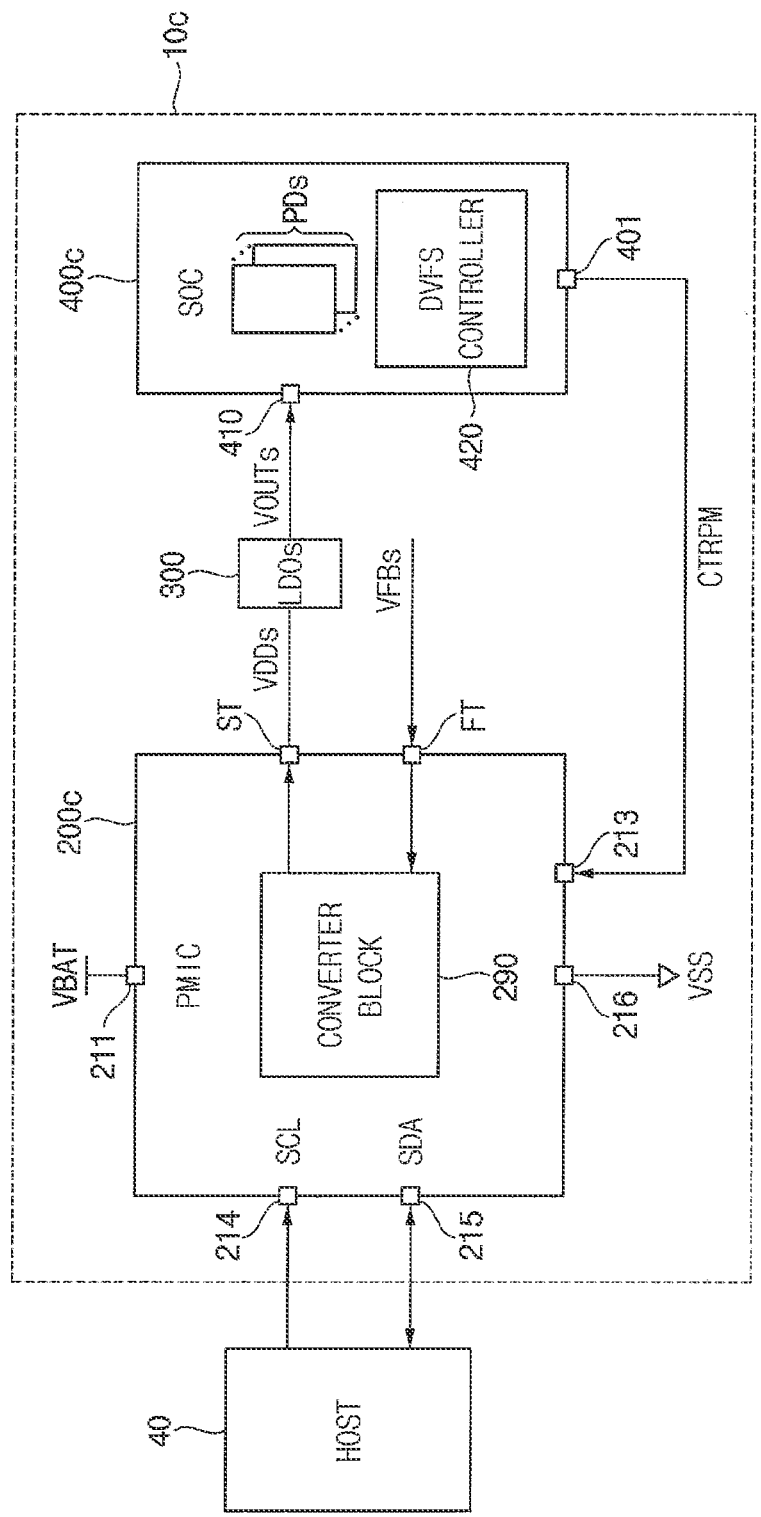
FIG. 6 is a block diagram illustrating a computational system according to embodiments of the inventive concept.

FIG. 6 is a block diagram illustrating a computational system 5 according to embodiments of the inventive concept.

Referring to FIG. 6, the computing system 5 may include a host 40 and a mobile device 10c and the mobile device 10c including the PMIC 200c, LDO regulators 300 and an IC (e.g., a SoC 400c).

The PMIC 200c may include one of the PMIC 200 of FIG. 1, the PMIC 200a of FIG. 2A, or the PMIC 200b of the PMIC 200b. The SoC 400c may correspond to the IC 400 of FIGS. 1 and 2A.

The host 40 may be a master device communicating with the PMIC 200c. For example, the host 40 may drive a serial clock line SCL and a serial data line SDA between the host 40 and the PMIC 200c in compliance with one or more established communication protocol(s), such as a serial peripheral interface (SPI) protocol, an inter-integrated circuit (I2C) protocol, or an I3C protocol. The host 40 may communicate (e.g., transmit and/or receive) an SCL signal (clock signal) to the PMIC 200c through the SCL, and may communicate an SDA signal (data signal) synchronized with the SCL signal to the PMIC 200c through the SDA.

The host 40 may initiate communication by driving the SCL to a first logical state (e.g., a logical "high") and driving the SDA from high to a second logical state (e.g., a logical "low"). The host 40 may communicate the SDA signal including address bits of the PMIC 200c and an R/W bit indicating a read operation or a write operation to the PMIC 200c. The host 40 may receive the SDA signal including an acknowledge (ACK) bit from the PMIC 200c. The host 40 may check (or determine) whether the address bits and the R/W bit are successfully communicated to the PMIC 200c using the ACK bit.

The PMIC 200c may be a slave device that may communicate with the host 40. The PMIC 200c may include an SCL terminal 214 that is connected to the SCL and receives the SCL signal and an SDA terminal 215 that is connected to the SDA and receives the SDA signal or outputs the SDA signal.

The PMIC 200c may include an input voltage terminal 211 receiving an battery voltage VBAT, a ground voltage terminal 216 receiving a ground voltage VSS, a switching pin ST providing power supply voltages VDDs and a feedback pin FT receiving feedback voltages VFBs. The PMIC 100 may further include a converter block 290 that generates the power supply voltages VDDs in response to the battery voltage VBAT and provides the power supply voltages VDDs to the LDO regulators 300. The converter block 290 may include DC-DC converters, wherein each of the DC-DC converters generates a corresponding one of the power supply voltages VDDs.

The LDO regulators 300 may generate various output voltages VOUTs in response to the power supply voltages VDDs, and may provide the power supply voltages VDDs to power domains PDs of the SoC 400c through voltage terminals 410.

The feedback voltage VFBs may be voltages corresponding to the power supply voltages VDDs that are fed back to the PMIC 200c after the power supply voltages VDDs are supplied to the LDO regulators 300. For example, the power supply voltages VDDs may be directly provided to the PMIC 200c, and each level of the feedback voltages VFBs may be the same as a level of corresponding one of the power supply voltages VDDs.

Alternately or additionally, the power supply voltages VDDs may be indirectly provided to the PMIC 200c. For example, the power supply voltages VDDs may be provided to the PMIC 200c through a voltage divider or a filter circuit including passive components (e.g., a resistor, a capacitor, an inductor, and so on.). In this case, the voltage divider or the filter circuit may be placed on a substrate on which the PMIC 200c and the SoC 400c are mounted. In this case, each level of the feedback voltages VFBs may be different from as a level of corresponding one of the power supply voltages VDDs.

Figure 7:
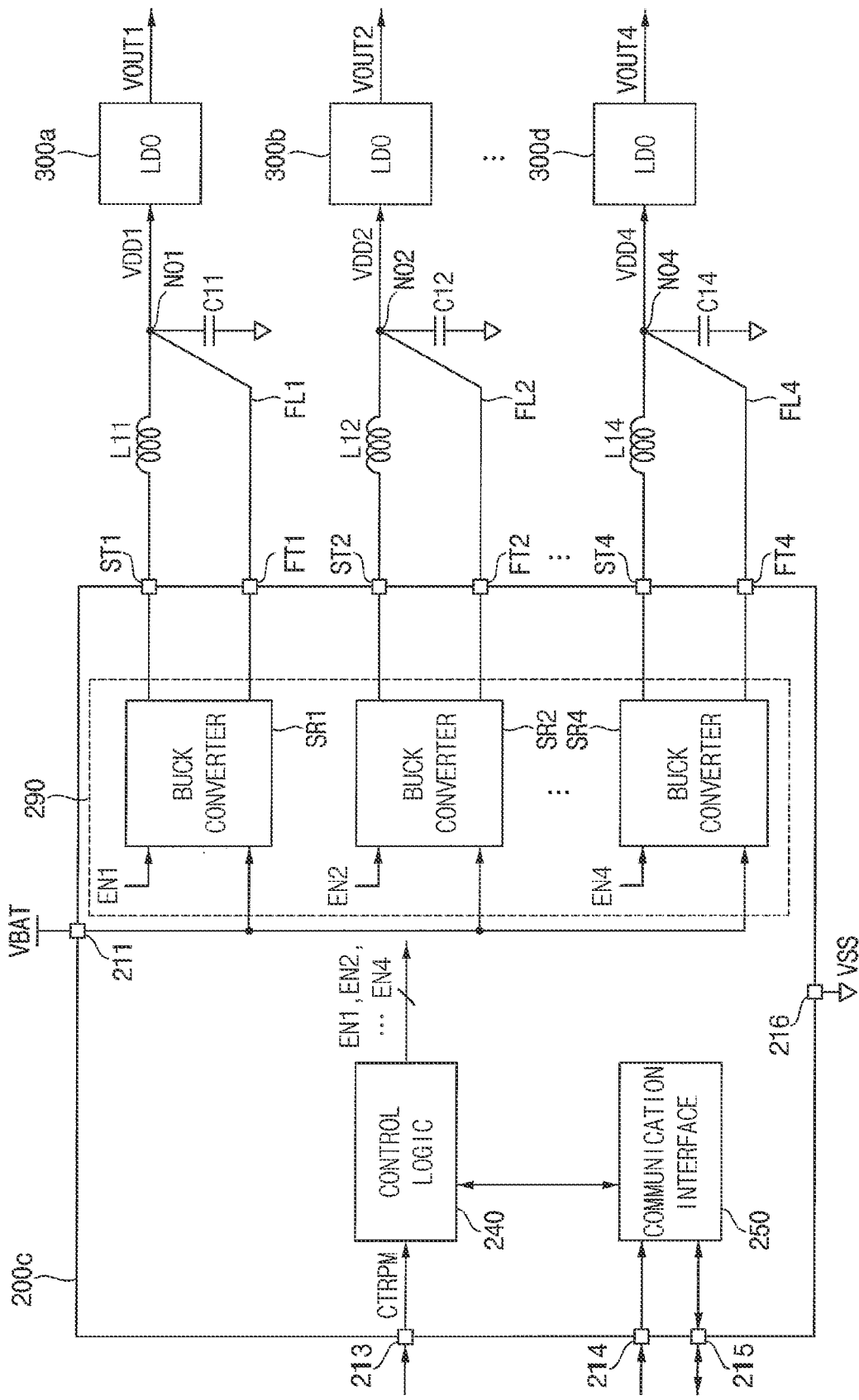
FIG. 7 is a block diagram further illustrating in one example the PMIC and LDO regulators of the computational system of FIG. 6 according to embodiments of the inventive concept.

FIG. 7 is a block diagram illustrating the PMIC 200c and LDO regulators 300 (inclusive of 300a, 300b and 300d) of FIG. 6 according to embodiments of the inventive concept. As will be appreciated by those skilled in the art, the PMIC 200c may include any reasonable number of DC-DC converters of various design, enabled by one or more enable signals EN, and configured in relation to any reasonable number of switching terminals ST, power supply voltages VDD, output nodes NO, feedback terminal FT, and feedback lines FL, together with related passive devices.

Referring to FIGS. 6 and 7, the PMIC 200c may include an input voltage terminal 211, a general purpose input/output (I/O) terminal (GPIO) 213, switching terminals ST1, ST2 and ST4, feedback terminals FT1, FT2 and FT4, a ground voltage terminal 216, an SCL terminal 214, an SDA terminal 215, a control logic 240, a communication interface 250 and the converter block 290. The converter block 290 may include DC-DC converters SR1, SR2 and SR4.

Each of the DC-DC converter SR1, SR2 and SR4 may be connected to respective switching terminals ST1, ST2 and ST4 and may provide respective power supply voltages VDD1, VDD2 and VDD4 to respective output nodes NO1, NO2 and NO4 through respective switching terminals ST1, ST2 and ST4. Each of the DC-DC converters SR1, SR2 and SR4 may be connected to respective feedback terminals FT1, FT2 and FT4 and may receive respective one of power supply voltages VDD1, VDD2 and VDD4 through respective feedback lines FL1, FT2 and FL4 connected to respective feedback terminals FT1, FT2 and FT4.

The mobile device 10c may further include inductors L11, L12 and L14 and output capacitors C11, C12 and C14. Each of the inductors L11, L12 and L14 may be coupled between respective switching terminals ST1, ST2 and ST4 and respective output nodes NO1, NO2 and NO4. Each of the output capacitors C11, C12 and C14 may be coupled between respective output nodes NO1, NO2 and NO4 and the ground voltage VSS.

The control logic 240 may receive a power management control signal CTRPM from the SoC 400c through the GPIO 213 and may control each of the DC-DC converters SR1, SR2 and SR4 in response to (or based on) the power management control signal CTRPM.

The control logic 240 may control activation/deactivation of each of the DC-DC converters SR, SR2 and SR4 in response to the power management control signal CTRPM. The control logic 240 may generate enable signals EN1, EN2 and EN4 in response to the power management control signal CTRPM, and may provide the enable signals EN1 to EN4 to respective DC-DC converters SR1, SR2 and SR4 in order to control activation/deactivation of the DC-DC converters SR1, SR2 and SR4.

The communication interface 250 may be connected to the host 40 through the SCL terminal 214 and the SDA terminal 215, and may variously communicate data with the host 40 as well as and signals with the control logic 240.

Each of the LDO regulators 300a, 300b and 300d may receive one of power supply voltages VDD1, VDD2 and VDD4, and may generate an output voltages VOUT1, VOUT2 and VOUT4 in response to the power supply voltages VDD1, VDD2 and VDD4.

Figure 8:
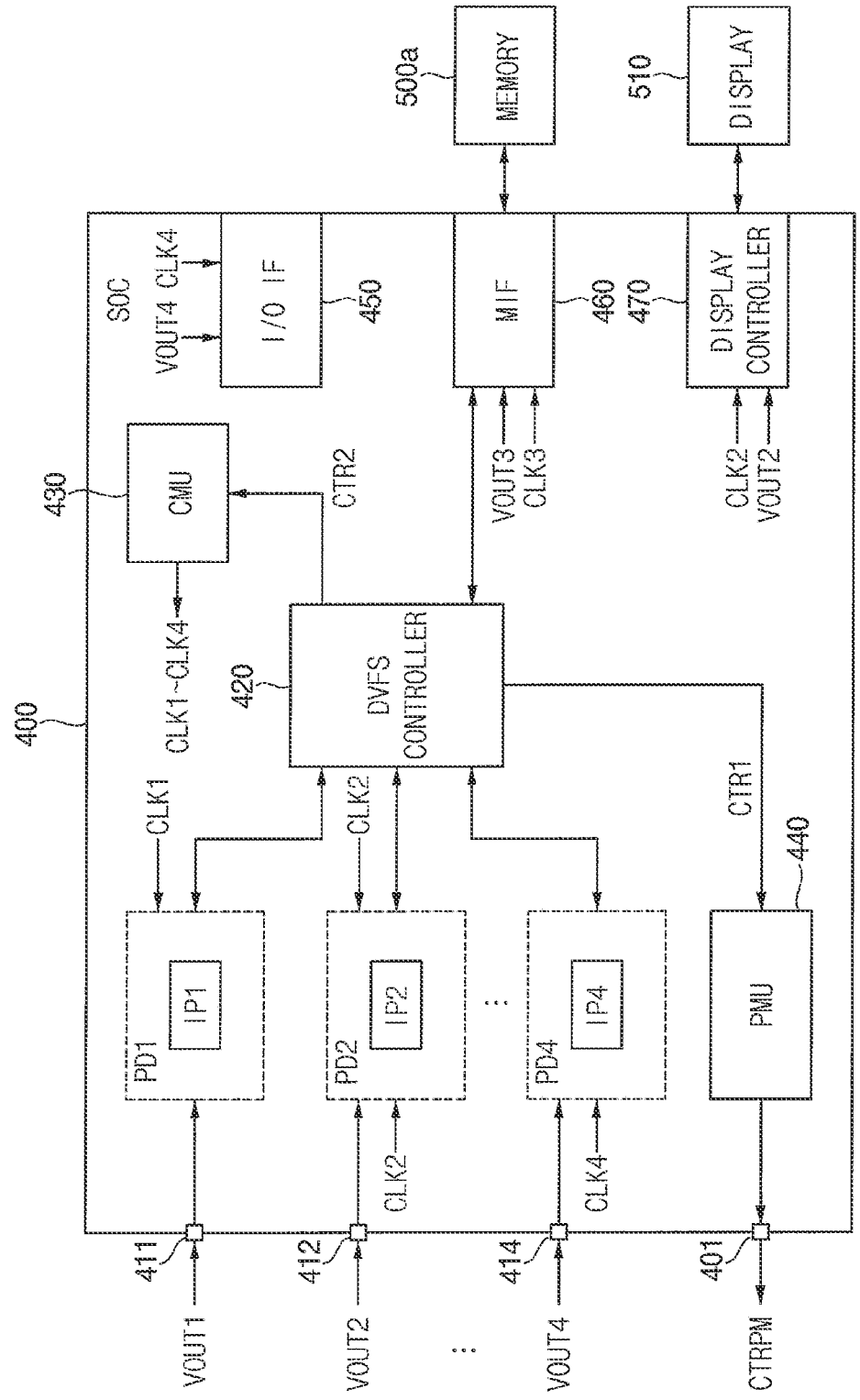
FIG. 8 is a block diagram further illustrating in one example the SoC 400 of the mobile device of FIG. 6 according to embodiments of the inventive concept.

FIG. 8 is a block diagram further illustrating in one example the IC 400 (e.g., the SoC die 400c of FIG. 6) according to embodiments of the inventive concept.

Referring to FIGS. 6 and 8, the SoC 400c may include voltage terminals 411, 412 and 414, a GPIO terminal 401, functional blocks IP1, IP2 and IP4, and a dynamic voltage and frequency scaling (DVFS) controller 420. In some embodiments, the IC 400 may further include a clock management unit (CMU) 430, a power management unit (PMU) 440, a memory interface (MIF) 460, an I/O interface (I/O IF) 450 and a display controller 470. In some embodiments, the IC 400 may be an application processor (AP), a mobile AP, or the like.

The memory interface 460 may be connected to an external memory 500a and the display controller 470n may be connected to an external display 510. The external memory 500a may correspond to the memory 500 of FIGS. 1 and 2A.

In some embodiments, each of the functional blocks IP, IP2 and IP4 may belong to a different one of the power domains PD1, PD2 and PD4. However, in other embodiments, one or more functional blocks may belong to one or more of the power domains PD1, PD2 and PD4.

Each of the output voltages VOUT1, VOUT and VOUT4 may be provided to one of the power domains PD, PD2 and PD4 through one of the voltage terminals 411, 412 and 414 and each of clock signals CLK1, CLK2 and CLK4 may be provided to respective power domains PD1, PD2 and PD4 from the CMU 430. Each of the functional blocks IP, IP2 and IP4 belonging to respective power domains PD1, PD2 and PD4 may operate in response to a respective output voltage VOUT1, VOUT2 and VOUT4 and in response to a respective clock signal CLK1, CLK2 and CLK4.

The DVFS controller 420 may perform DVFS on the power domains PD1, PD2 and PD4 by adjusting the frequency of each clock signals CLK1, CLK2 and CLK4 and/or adjusting the voltage level of each of the output voltages VOUT1, VOUT2 and VOUT4. Here, those skilled in the art will appreciate that various DVFS technology may be used to dynamically controls or adjust the operating frequency and voltage level of signals associated with the IC 400 in order to reduce overall power consumption.

The CMU 430 may be used to generate the clock signals CLK1, CLK2, CLK3 and CLK4 (collectively, "CLK1 to CLK4") and may variously increase, maintain or decrease the frequency of each of the clock signals CLK1 to CLK4 in response to a clock control signal CTR2 provided by the DVFS controller 420.

The PMU 440 may monitor the current power consumption of the IC 400, store control value(s) defining a permitted level of power consumption for the IC 400 in various operating modes, and compare a current level of power consumption with the permitted level of power consumption. Accordingly, the PMU 440 may generate the power control management control signal CTRPM, that may be used to control the PMIC 200c in response to a power control signal CTR1 and/or a result of the comparing operation. In this regard, the power control management control signal CTRPM may be provided to the PMIC 200c through the GPIO terminal 401.

The memory interface 460 may control or facilitate data communication between the SoC 400c and the external memory 500a. In some embodiments, for example, the memory interface 160 may operate in response to the clock signal CLK3 and the output voltage VOUT3, and the memory interface 160 may belong to the third power domain.

The external memory 500a may communicate data with the IC 400 via the memory interface 460. In some embodiments, the external memory 500a may include at least one volatile memory, such as a dynamic random access memory (DRAM), a synchronous DRAM (SDRAM), a static random access memory (SRAM), etc., and/or at least one nonvolatile memory such as an electrically erasable programmable read-only memory (EEPROM), a flash memory, a phase change random access memory (PRAM), a resistance random access memory (RRAM), a magnetic random access memory (MRAM), a ferroelectric random access memory (FRAM), a nano floating gate memory (NFGM), or a polymer random access memory (PoRAM), etc. Alternately, the memory device 500a may include a solid state drive or solid state disk (SSD), an embedded SSD (eSSD), a multimedia card (MMC), an embedded MMC (eMMC), a universal flash storage (UFS), etc.

The I/O interface 450 may control or facilitate data communication between the SoC 400c and an external system (not illustrated). In example embodiments, the I/O interface 450 may support a serial advanced technology attachment (SATA), a SATA express (SATAe), a SAS (serial attached small computer system interface (SCSI)), a peripheral component interconnect-express (PCIe®), a nonvolatile memory express (NVMe), or a mobile industry processor interface (MIPI®).

The display controller 470 may control or facilitate data communication between the SoC 400c and the display 510. The display 510 may be disposed outside the SoC 400c and may display image data form the SoC 400c. For example, the display 510 may operate in response to the clock signal CLK2 and the output voltage VOUT2. The memory interface 160 may belong to the second power domain.

In example embodiments, at least a part of the DVFS controller 420, the CMU 430 and the PMU 440 may be implemented in hardware. For example, at least a part of the DVFS controller 420, the CMU 430 and the PMU 440 may be implemented as instructions or program routines (e.g., a software program). For example, the instructions or the program routines may be stored in an internal storage (not illustrated) included in the IC 400 or the external memory 500a.

Although not illustrated in FIG. 8, the IC 400 may include a performance monitoring unit that measures (e.g., counts) certain performance parameters associated with the function blocks IP1, IP2 and IP4, the memory interface 460 and/or the display controller 470. For example, the performance parameters may include instruction cycles, respective workloads, cache hits, cache misses, branch misses, etc. The DVFS controller 120 may control the DVFS in response to results provided by the performance monitoring unit.

Figure 9:
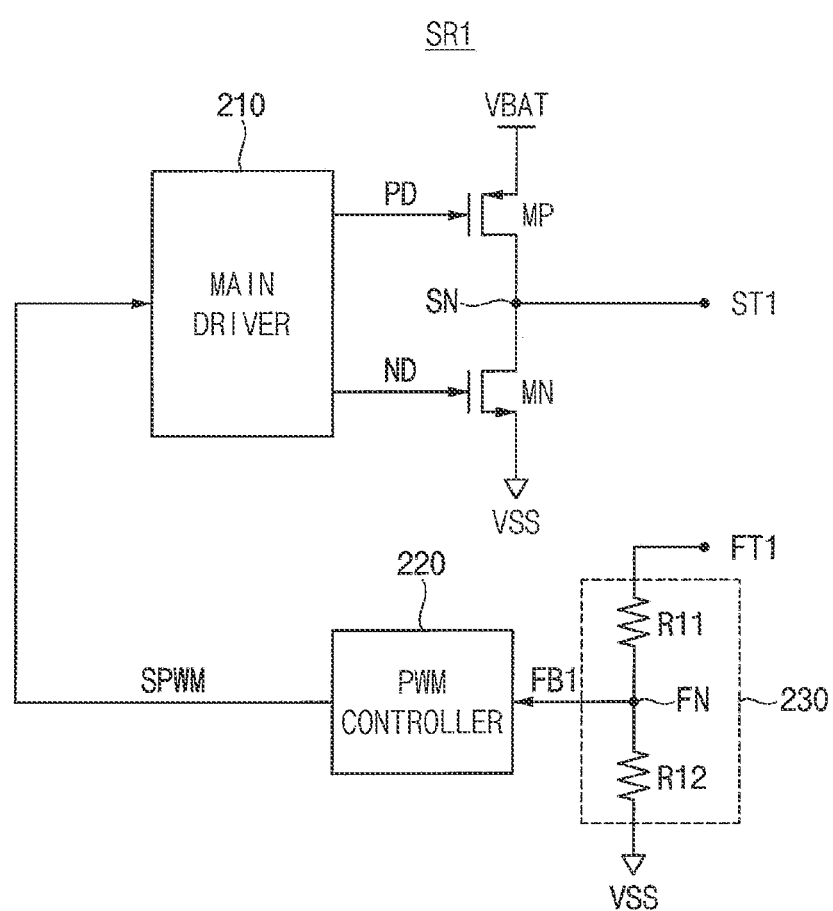
FIG. 9 is a block diagram illustrating a DC-DC converter that may be used in embodiments of the inventive concept.

FIG. 9 is a block diagram further illustrating in one example a DC-DC converter (e.g., SR1) of the PMIC 200c of FIG. 7 according to embodiments of the inventive concept. Here, an example of SR1 is described, but similar converters may be used in any one of DC-DC converters SR1, Sr2 and SR4.

Referring to FIG. 9, the DC-DC converter SR1 may include a main driver 210, a first power switch MP, a second power switch MN, a feedback circuit 230 and a pulse width modulation (PWM) controller 220.

The first power switch MP may be coupled between the battery voltage VBAT and a switching node SN connected to the switching terminal SN1 and may include a PMOS transistor that has a source coupled to the battery voltage VBAT, a gate receiving a first driving control signal PD and a drain coupled to the switching node SN. The second power switch MN may be coupled between the switching node SN and a ground voltage VSS. The second power switch MP may include an NMOS transistor which has a drain coupled to the switching node SN, a gate receiving a second driving control signal ND and a source coupled to the ground voltage VSS.

The PWM controller 220 may generate a PWM signal SPWM in response to a feedback voltage FB1 which may be proportional to the power supply voltage VDD1 in FIG. 7. The controller 220 may generate the PWM signal SPWM by performing a PWM on the feedback voltage FB1.

Embodiments of the inventive concept may be applied to various systems including a memory module and a memory controller including an ECC engine.

The feedback circuit 230 may generate the feedback voltage FB1 which is proportional to the power supply voltage VDD1 and may provide the feedback voltage FB1 to the PWM controller 220. The feedback circuit 230 may include dividing resistors R11 and R12 connected between the feedback terminal FT1 and the ground voltage VSS and the dividing resistors R11 and R12 may be connected to each other at a feedback node FN.

For example, as illustrated in FIG. 9, the feedback circuit 230 may generate the feedback voltage FB corresponding to a ratio of resistance values of the dividing resistors R11 and R12, but example embodiments are not limited thereto.

As illustrated in FIG. 9, each of the DC-DC converters SR1, SR2 and SR4 may be implemented as a buck converter receiving a battery voltage VBAT, and generating a power supply voltage having a level is relatively less than the level of the battery voltage VBAT.

Figure 10:
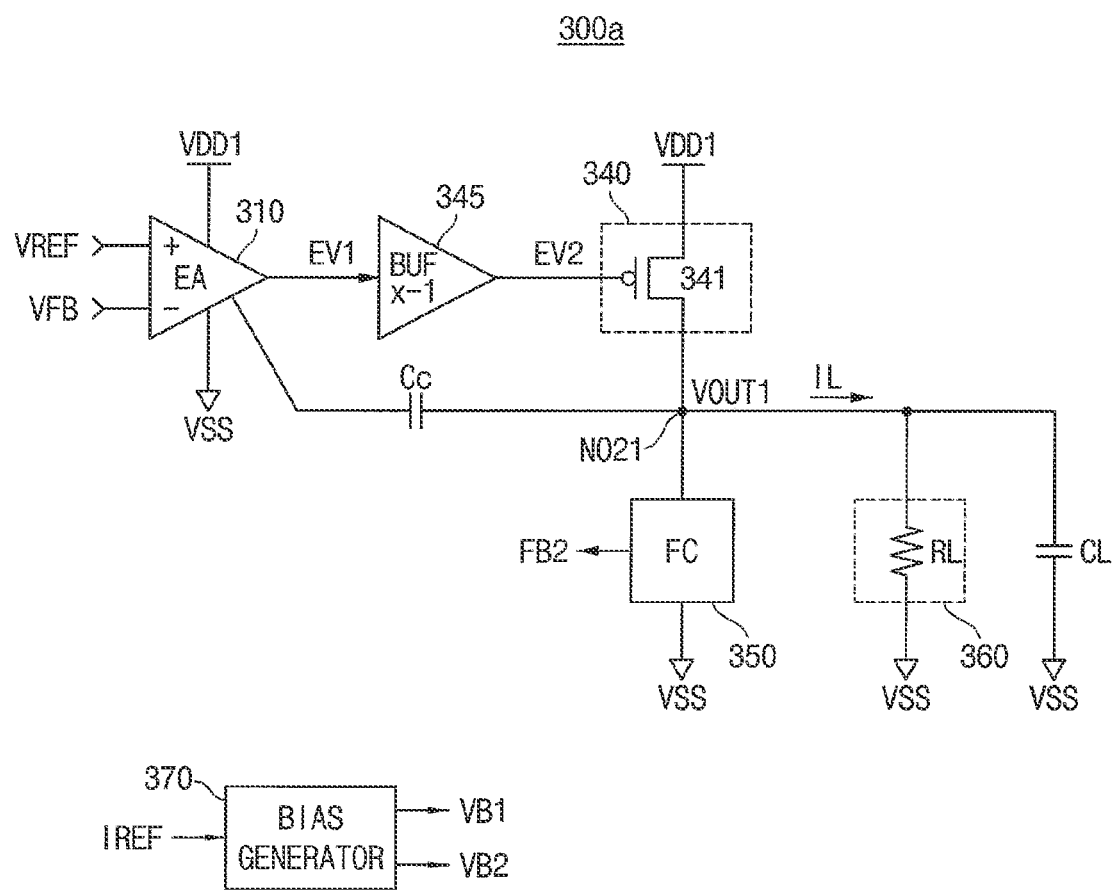
FIG. 10 is a block diagram illustrating a LDO regulator that may be used in embodiments of the inventive concept.

FIG. 10 is a block diagram illustrating in one example the LDO regulator 300a of FIG. 7 according to embodiments of the inventive concept. Here, an example of LDO regulator 300a is described, but similar LDO regulators may be used for any one of LDO regulators 300a, 300b ... 300d of FIG. 7.

Referring to FIG. 10, the LDO regulator 300a may include an error amplifier (EA) 310, a buffer (BUF) 340, a pass element 340 including a power transistor 341 and a feedback circuit (FC) 350. Additionally, the LDO regulator 300a may include a compensation capacitor Cc and a bias generator 370 and a reference generator 450, wherein the compensation capacitor Cc is connected between an internal node of the error amplifier 310 and an output node NO21.

As illustrated in FIG. 10, a load 360 and a load capacitor CL may be connected between the output node NO21 and the ground voltage VSS. The load capacitor CL may be connected between the output node NO21 and ground voltage VSS in parallel with the load capacitor CL, and the load 360 may include a load resistor RL.

The error amplifier 310 may be connected between the power supply voltage VDD1 and the ground voltage VSS, may receive a reference voltage VREF and a feedback voltage VFB, may compare the reference voltage VREF and the feedback voltage VFB, may amplify a difference between the reference voltage VREF and the feedback voltage VFB in response to the comparison to generate a first error voltage EV1 corresponding to the difference and may output the first error voltage EV1 to the buffer 345.

The first error voltage EV1 may correspond to the difference between the reference voltage VREF and the feedback voltage VFB. The error amplifier 310 has a positive (+) input terminal to receive the reference voltage VREF and a negative (−) input terminal to receive the feedback voltage VFB.

The buffer 345 may buffer the first error voltage EV1 and may output a second error voltage EV2 to a gate of the power transistor 341. The buffer 345 may have a gain of −1.

The power transistor 341 may have a gate receiving the second error voltage EV2, and may regulate the power supply voltage VDD1 in response to the second error voltage EV2 to provide the output voltage VOUT1 to the output node NO21. A load current IL corresponding to the output voltage VOUT1 is provided to the load 360 from the output node NO21.

The power transistor 341 has a source coupled to the power supply voltage VDD1, a gate to receive the second error voltage EV2 and a drain coupled to the output node NO21. When the load current IL increases, a level of the output voltage VOUT1 decreases and a level of the first error voltage EV1 increases. A level of the second error voltage EV2 decreases in response to the level of the first error voltage EV1 increasing. When the level of the second error voltage EV2 decreases, the level of the output voltage VOUT1 increases.

When the load current IL decreases, the level of the output voltage VOUT1 increases and the level of the first error voltage EV1 decreases. The level of the second error voltage EV2 increases in response to the level of the first error voltage EV1 decreasing. When the level of the second error voltage EV2 increases, the level of the output voltage VOUT1 decreases.

Therefore, when the load current IL increases, the level of the second error voltage EV2 decreases and when the load current IL decreases, the level of the second error voltage EV2 increases.

The feedback circuit 350 may be connected between the output node NO21 and the ground voltage VSS, may generate a feedback voltage FB2 by dividing the output voltage VOUT1 and may provide the feedback voltage FB2 to the error amplifier 310.

The bias (voltage) generator 370 may generate a first bias voltage VB1 and a second bias voltage VB2 in response to a reference current IREF and may provide the first bias voltage VB1 and the second bias voltage VB2 to the error amplifier 100.

Figure 11:
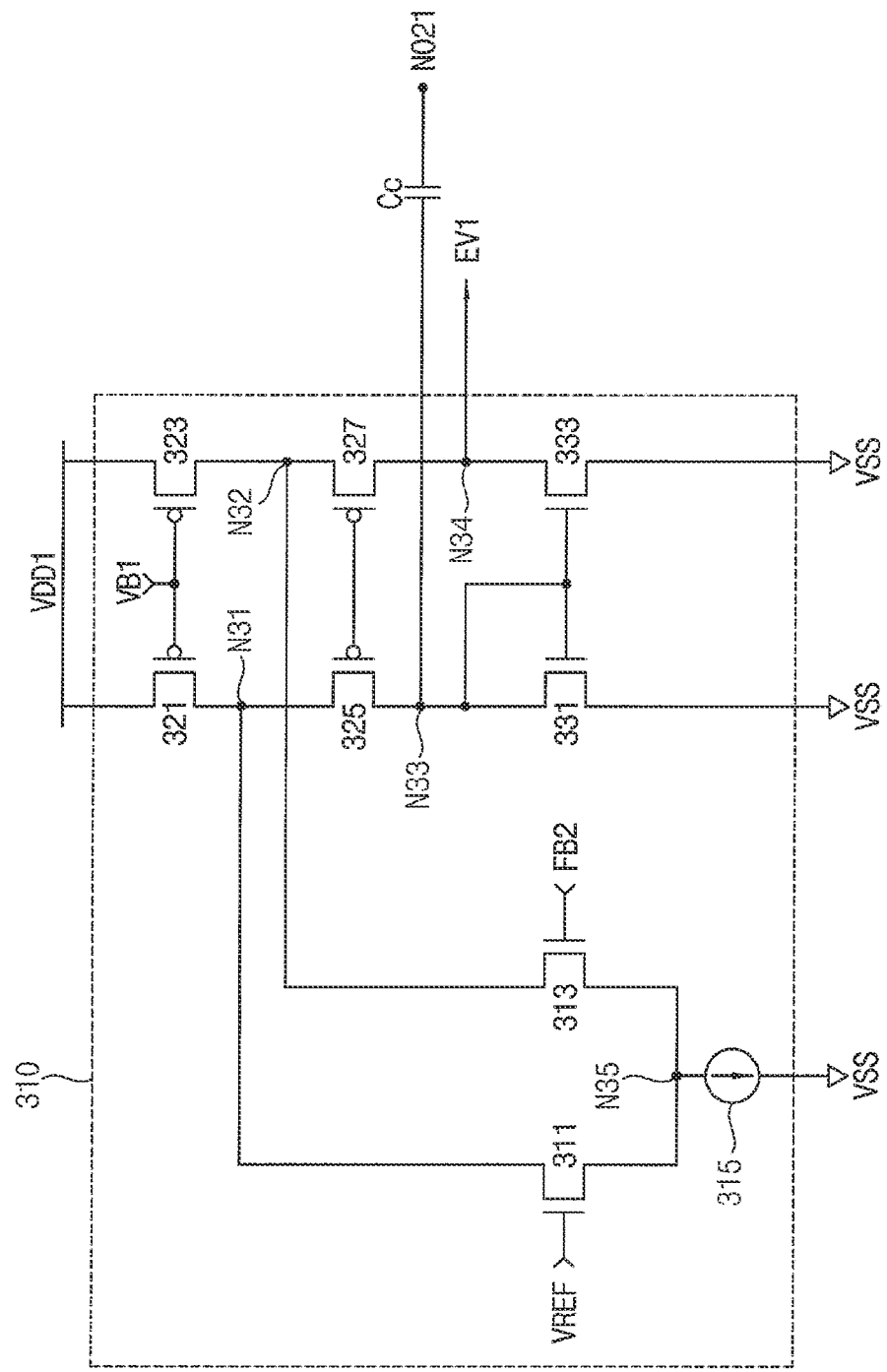
FIG. 11 is a circuit diagram further illustrating in one example the error amplifier in the LDO regulator of FIG. 10 according to embodiments of the inventive concept.

FIG. 11 is a circuit diagram further illustrating in one example the error amplifier 310 of the LDO regulator of FIG. 10 according to embodiments of the inventive concept.

Referring to FIG. 11, the error amplifier 310 may include first, second, third and fourth PMOS transistors 321, 323, 325 and 327, first, second, third and fourth NMOS3 transistors 331, 333, 311 and 313, and a current source 315.

The first PMOS transistor 321 is connected between the power supply voltage VDD1 and a first node N31. The second PMOS transistor 323 is connected between the power supply voltage VDD1 and a second node N32 and has a gate coupled to a gate of the first PMOS transistor 321. A gate of the first PMOS transistor 321 and a gate of the second PMOS transistor 323 receive the first bias voltage VB1.

The third PMOS transistor 325 is connected between the first node N31 and a third node N33. The fourth PMOS transistor 327 is connected between the second node N32 and a fourth node N34 and has a gate coupled to a gate of the third PMOS transistor 325. A gate of the third PMOS transistor 325 and a gate of the fourth PMOS transistor 327 receive the second bias voltage VB2.

The first NMOS transistor 331 is connected between the third node N33 and the ground voltage VSS and has a gate coupled to the third node N33. The second NMOS transistor 333 is connected between the fourth node N34 and the ground voltage VSS and has a gate coupled to the third node N33. Therefore, the first NMOS transistor 331 and the second NMOS transistor 333 may constitute a current mirror.

The third NMOS transistor 311 is connected between the first node N31 and a fifth node N35, and has a gate receiving the reference voltage VREF. The fourth NMOS transistor 313 is connected between the second node N32 and the fifth node N35, and has a gate receiving the feedback voltage FB2. The current source 315 is connected between the fifth node N35 and the ground voltage VSS and provides a constant current to the fifth node N35.

When reference voltage VREF is provided to a gate of the third NMOS transistor 311 and the feedback voltage FB2 is provided to a gate of the fourth NMOS transistor 213, currents provided to drains of the third PMOS transistor 225 and the fourth PMOS transistor 227 are determined in response to the reference voltage VREF and the feedback voltage FB2, respectively.

Since the first NMOS transistor 331 and the second NMOS transistor 333 constitute a current mirror, current flowing through the first NMOS transistor 331 and the second NMOS transistor 333 are the same. Therefore, the first error voltage EV1 provided to the buffer 345 from the fourth node N34 has a level corresponding to the difference of the feedback voltage FB2 and the reference voltage VREF.

In addition, the compensation capacitor Cc may be coupled between the third node N33 and the output node NO21.

Figure 12:
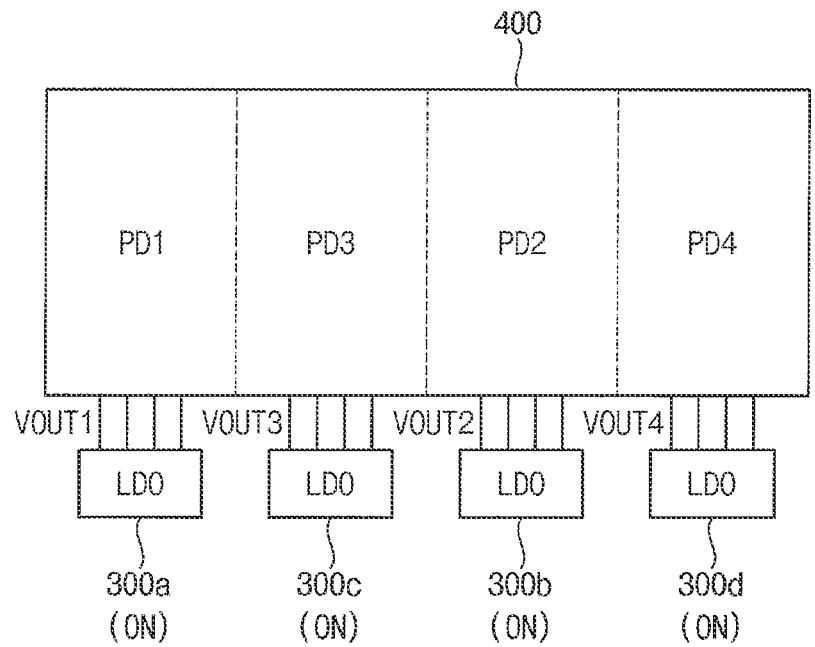
FIGS. 12 and 13 are respective block diagrams illustrating various examples of controlling power of the power domain of the IC die in the mobile device of FIG. 3 according to embodiments of the inventive concept.
Figure 13:
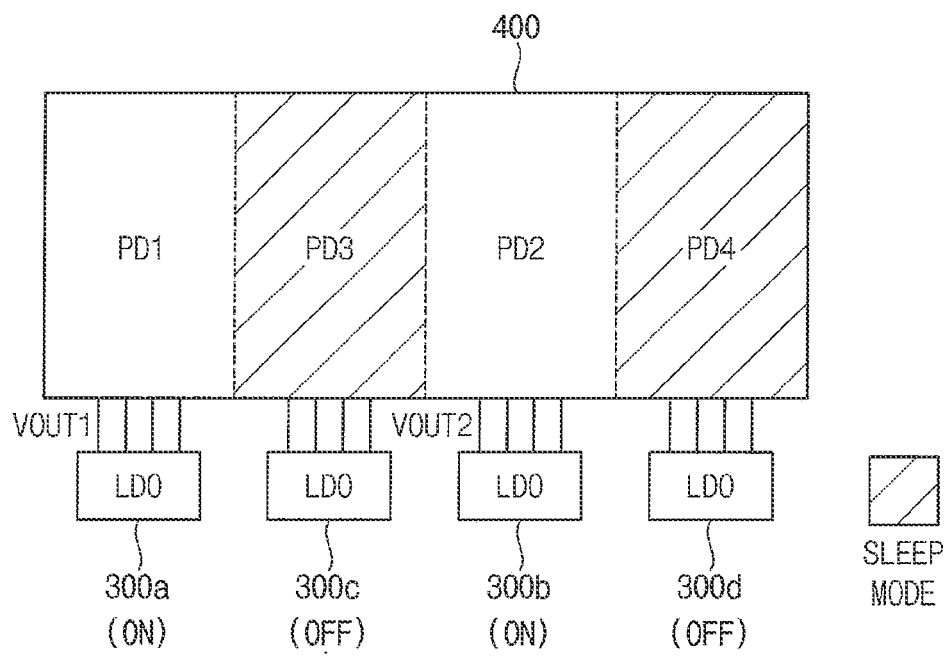

FIGS. 12 and 13 are respective block diagrams illustrating examples of controlling power of power domains in the IC die 400 of FIG. 3 according to embodiments of the inventive concept.

Referring to FIGS. 3 and 12, during a normal mode of operation, the LDO regulators 300a, 300c, 300b and 300d are activated (ON) and each of the LDO regulators 300a, 300c, 300b and 300d may provide respective output voltages VOUT1, VOUT3, VOUT2 and VOUT4 to respective power domains PD1, PD3, PD2 and PD4. At least one functional block in each of the power domains PD1, PD3, PD2 and PD4 may operate in response to the respective output voltages VOUT1, VOUT3, VOUT2 and VOUT4.

Referring to FIGS. 3 and 13, during a low power operating mode, when the power domains PD3 and PD4 are placed in a sleep mode among the power domains PD1, PD3, PD2 and PD4, the LDO regulators 300a and 300b are activated (ON), and the LDO regulators 300c and 300d are deactivated (OFF). Accordingly, each of the activated LDO regulators 300a and 300b provides a respective output voltage VOUT1 and VOUT2 to a corresponding power domain PD1 and PD2.

Of comparative note, certain conventional mobile devices cut off power voltages provided to power domain(s) during a sleep mode using a power gating approach. However, certain embodiments of the inventive concept, dedicated LDO regulators may be variously and respectively assigned to the power domains PD1, PD3, PD2 and PD4. Thus, power consumption may be reduced by simply deactivating selected LDO regulators assigned to certain power domains during sleep mode, and accordingly, the power gating transistors used in the conventional approaches may be omitted.

Figure 14:
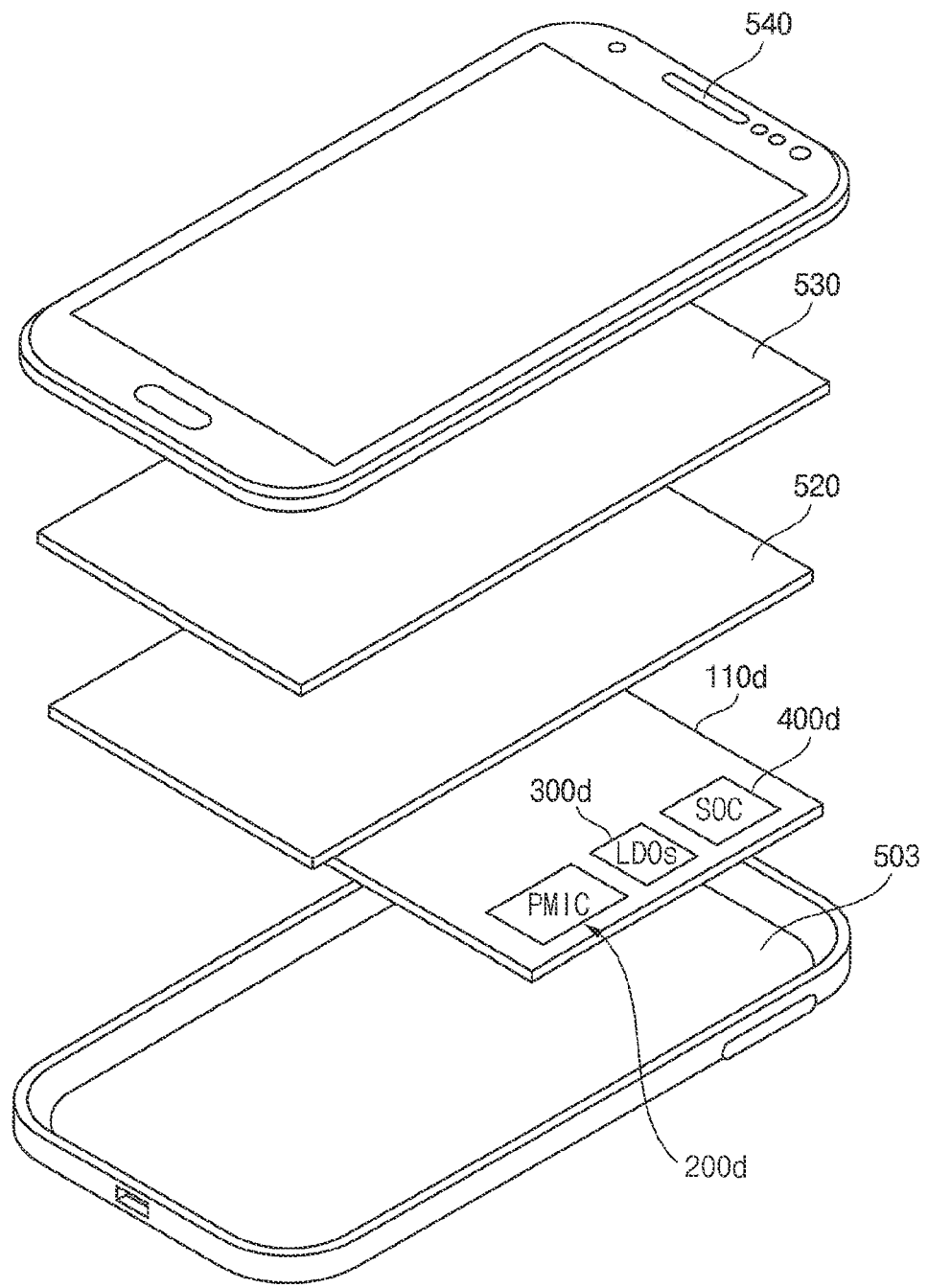
FIG. 14 is an exploded perspective view of a mobile device according to embodiments of the inventive concept.

FIG. 14 is an exploded perspective view of a mobile device 10d according to embodiments of the inventive concept.

Referring to FIG. 14, the mobile device 10d may include a housing 503, a PCB 110d, a display module 520, a touch sensing panel 530 and a window cover glass 540.

A smart-phone is exemplarily illustrated as the mobile device 10d in FIG. 14. However, the mobile device 10d according to example embodiments of the present disclosure is not limited to the smart-phone and may include one of various information supply devices such as a navigation device, a computer monitor, a tablet personal computer (PC), etc.

The housing 503 may accommodate internal components of the mobile device 10d. FIG. 14 exemplarily illustrates that the housing 503 is formed by one component but the housing 503 may be formed by combining at least two components. The housing 503 that is formed by one component will be exemplarily described in FIG. 14. In example embodiments, the housing 530 may accommodate a power source unit (not shown) such as a battery according to a type of a display panel.

An IC 400d (e.g., a SoC die) capable of processing data using an application program, a PMIC 200d capable of generating various power supply voltages in response to a battery voltage, and LDO regulators 300d capable of generating various output voltages may be mounted on the PCB 110d.

For example, the PMIC 200d may be mounted on a second side of the PCB 110d, the LDO regulators 300d may be mounted on a second side of a package substrate mounted on a first side of the PCB 110d by first interconnects and the SoC 400d may be mounted on a first side of the package substrate. The LDO regulators 300d may be disposed between the first interconnects and may provide a corresponding output voltage to respective one of power domains of the SoC 400d.

The display module 520 may display an image. A type of the display module 520 is not particularly limited and may be one of various display panels, e.g., an organic light-emitting display panel, a liquid crystal display panel, a plasma display panel, and an electro-wetting display panel, etc.

The touch sensing panel 530 may be an input unit of the display module 520 and may receive a touch signal. In example embodiments, the touch sensing panel 530 may be embodied in an electrostatic capacitance touch panel.

The window cover glass 540 may be disposed on the touch sensing panel 530, combined with the housing 503, and included in an outside surface of the mobile device 10d together with the housing 503.

Although not shown in FIG. 14, the mobile device 10d may also include various other components such as a wireless communication unit that establishes wireless communication, a memory unit (e.g., volatile memory/non-volatile memory) that stores data, a microphone, a speaker, and an audio processor.

Figure 15:
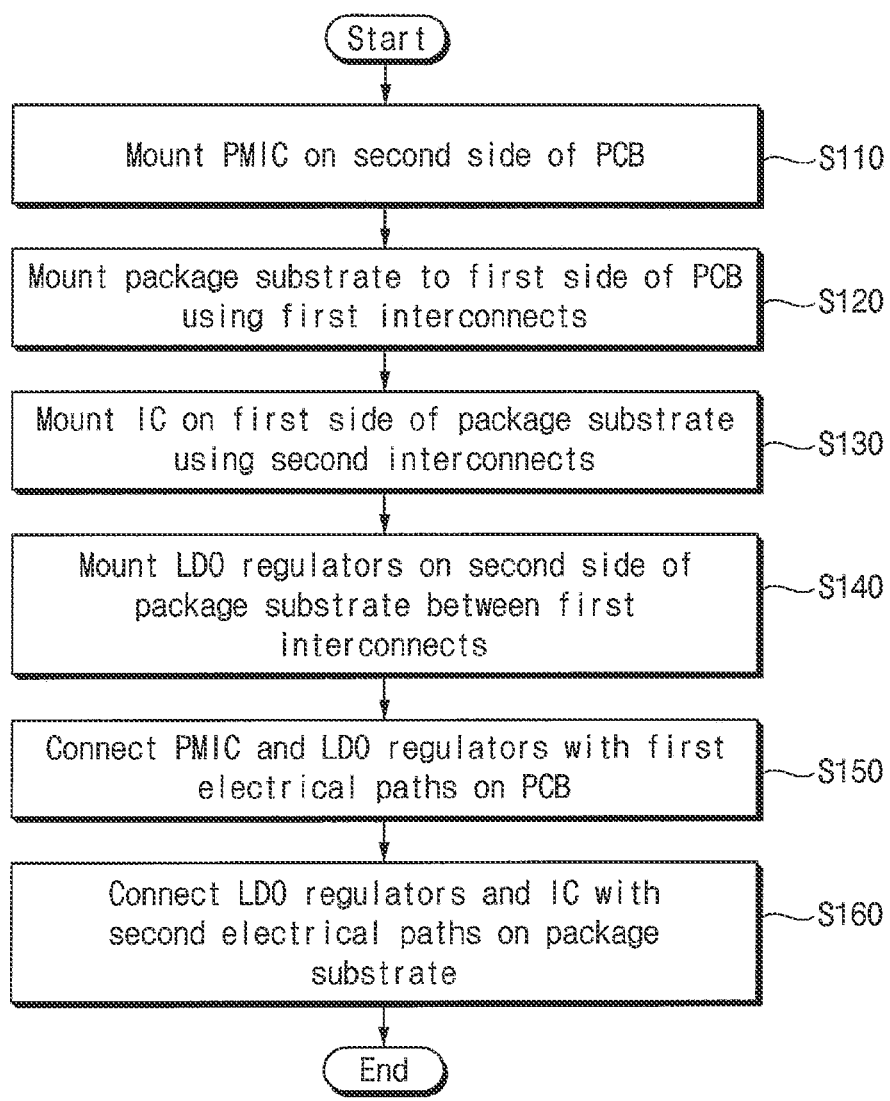
FIG. 15 is a flow chart illustrating a method of fabricating a mobile device according to embodiments of the inventive concept.

FIG. 15 is a flow chart illustrating a method of fabricating a mobile device according to embodiments of the inventive concept.

Referring to FIGS. 1, 2A, 2B, 3, 4, 5 and 15, a PMIC 200, 200a or 200b is mounted on a second side LF1 of a PCB 110 (S110).

A package substrate 150 having a first side UF2 and an opposing second side LF2 is mounted on a first side UF1 of the PCB 110 using first interconnects (S120).

An IC 400 is mounted on the first side UF2 of the package substrate 150 using second interconnects (S130).

LDO regulators 300a and 300b are mounted on the second side LF2 of the package substrate 150 between the first interconnects (S140).

First electrical paths 131, 132, 133 and 134 are used to connect the PMIC 200, 200a or 200b to the LDO regulators 300a and 300b mounted on the PCB 110 (S150).

Second electrical paths 151, 152, 154 and 156 are used to connect the LDO regulators 300a and 300b to the IC 400 mounted on the package substrate 150 (S160).

Accordingly, the LDO regulators 300a and 300b may be mounted on the second side LF2 of the package substrate 150 between the first interconnects. Hence, the LDO regulators 300a and 300b may provide output voltages to respective power domains of the IC 400. Therefore, the size of the PMIC 200, 200a or 200b, and the length of power rails, as well as a number of power balls used to transfer the output voltages may be reduced.

Figure 16:
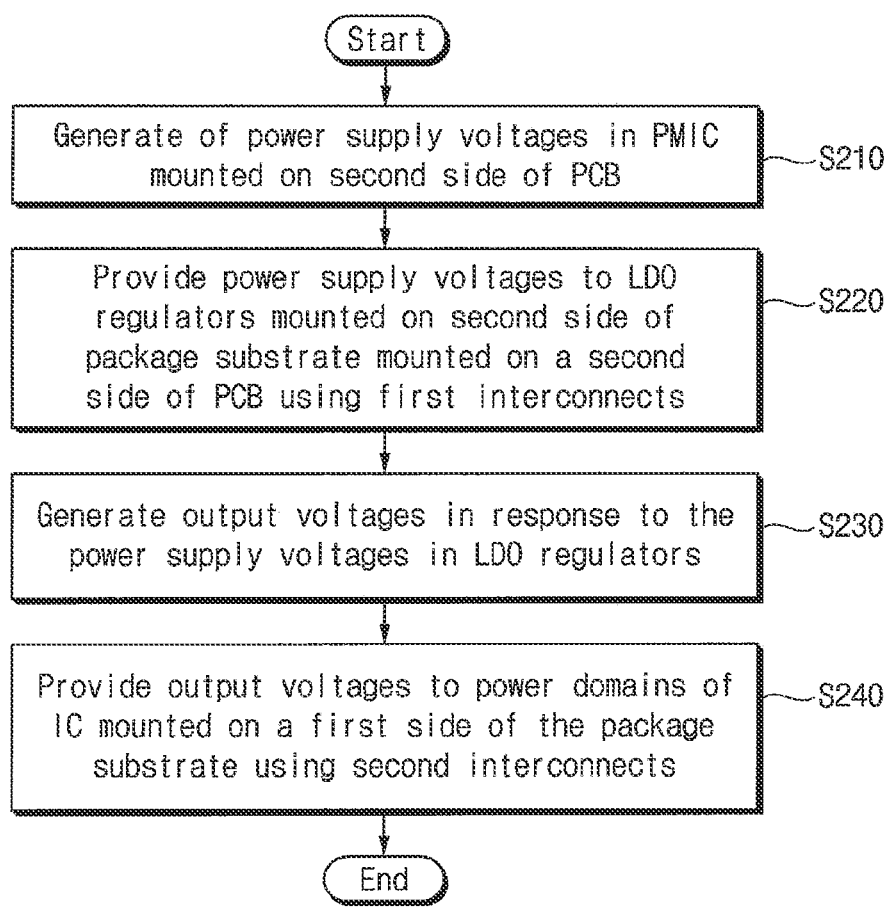
FIG. 16 is a flow chart illustrating a method of controlling power in a mobile device according to embodiments of the inventive concept.

FIG. 16 is a flow chart illustrating a method of controlling power in a mobile device according to embodiments of the inventive concept.

Referring to FIGS. 1, 2A, 2B, 3, 4, 5 and 16, a PMIC 200, 200a or 200b mounted on a second side LF1 of a PCB 110 having a first side UF1 and an opposing second side LF1 may be used to generate power supply voltages in response to a battery voltage (S210).

The PMIC 200, 200a or 200b provides the power supply voltages to LDO regulators 300a and 300b mounted on a second side LF2 of a package substrate 150 having a first side UF2 and an opposing second side LF2 which is mounted on the first side UF1 of the PCB 110 using first interconnects (S220). Here, the LDO regulators 300a and 300b are disposed between the first interconnects.

The LDO regulators 300a and 300b may be used to generate output voltages in response to the power supply voltages (S230).

Thus, the LDO regulators 300a and 300b may provide the output voltages to respective power domains of the IC 400 mounted on the first side UF2 of the package substrate 150 using second interconnects (S240).

Accordingly, the LDO regulators 300a and 300b mounted on the second side LF2 of the package substrate 150 between the first interconnects and the LDO regulators 300a and 300b provide output voltages to respective power domains of the IC 400. Therefore, the size of the PMIC 200, 200a or 200b, the length of power rails, and a number of power balls used to transfer output voltages may be reduced. In addition, because each of the LDO regulators 300a, 300c, 300b and 300d is dedicated in certain embodiments of the inventive concept to respective power domains PD1, PD3, PD2 and PD4, the power associated with each of the power domains PD1, PD3, PD2 and PD4 may be accurately adjusted.

Figure 17:
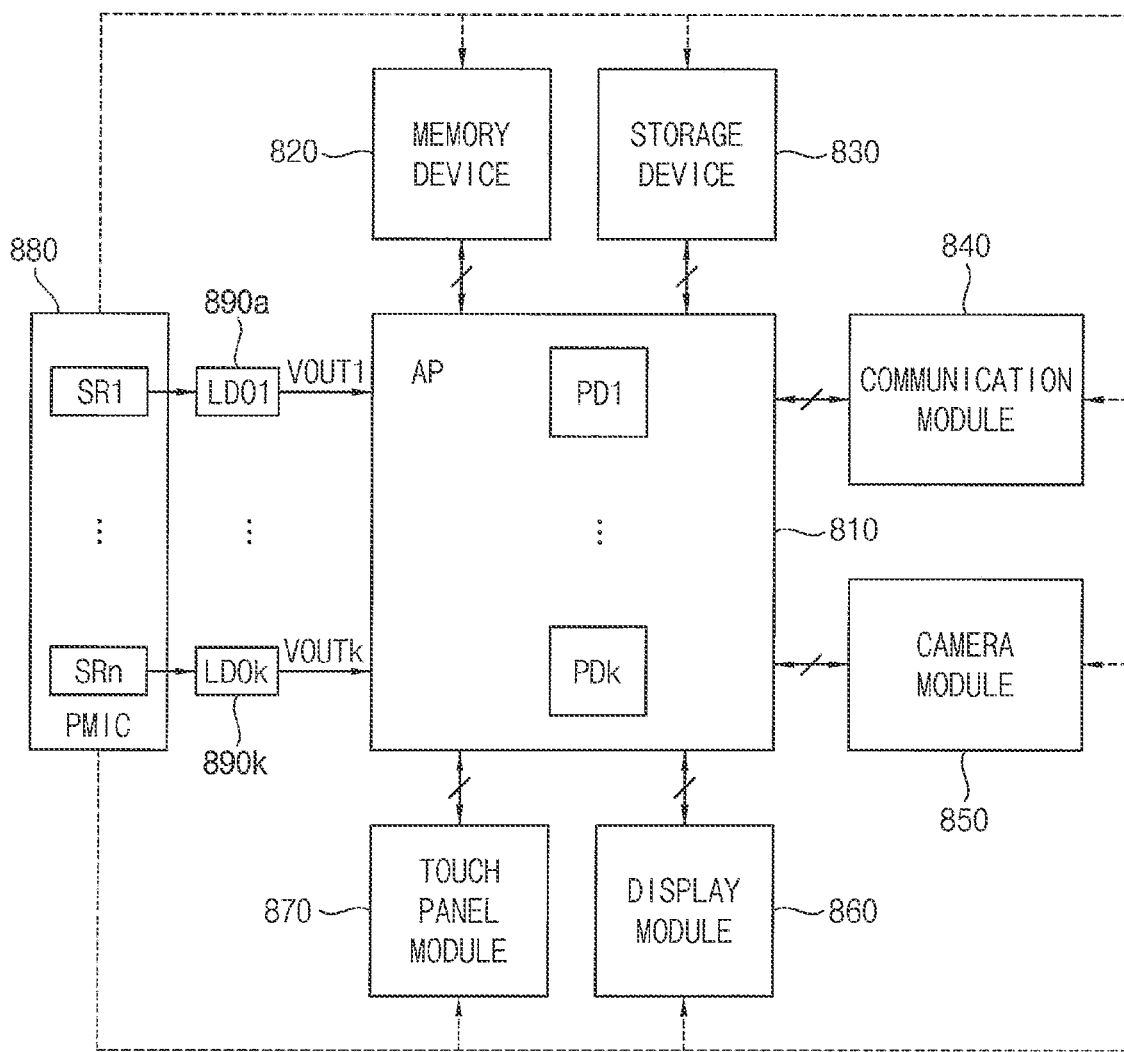
FIG. 17 is a block diagram illustrating a mobile device according to embodiments of the inventive concept.

FIG. 17 is a block diagram illustrating a mobile device 800 according to embodiments of the inventive concept.

Referring to FIG. 17, the mobile device 800 may include a SoC 810, a PMIC 880 and LDO regulators 890a to 890k, where 'k' is a positive integer. In some embodiments, the mobile device 800 may further include devices or modules 820, 830, 840, 850, 860 and 870, such as a memory device 820, a storage device 830, a communication module 840, a camera module 850, a display module 860, a touch panel module 870, etc. Here, for example, the mobile device 800 may be implemented as a smart-phone.

The SoC 810 may control overall operations of the mobile device 800. For example, the SoC 810 may control the memory device 820, the storage device 830 and the modules 840, 850, 860 and 870. Here, for example, the SoC 810 may be an application processor (AP) included in the mobile device 800.

The SoC 810 may correspond to the IC 400 in FIGS. 1 and 2A and may receive output voltages VOUT1 to VOUTk from the LDO regulators 890a to 890k. The SoC 810 may include power domains PD1 to PDk, and each of the power domains PD1 to PDk may include at least one function block. Each of the LDO regulators 890a to 890k may be dedicated to respective one of the power domains PD1 to PDk.

The PMIC 880 may include DC-DC converters SR1 to SRn which generate power supply voltages in response to a battery voltage, wherein 'n' is a positive integer. The DC-DC converters SR1 to SRn may provide the power supply voltages to the LDO regulators 890a to 890k.

As described in relation to the illustrated embodiments of FIGS. 1 and 4, the PMIC 880 may be mounted on a second side of a PCB and the SoC 810 and the LDO regulators 890a to 890k may be mounted on a first side and a second side of a package substrate, respectively, which is mounted on a first side of the PCB. Therefore, the mobile device 800 may reduce the length of power rails and a number of power balls which transfer the output voltages VOUT1 to VOUT to the power domains PD1 to PDk.

The memory device 820 and the storage device 830 may store data for operations of the mobile device 800. The memory device 820 may include a volatile memory device, such as a dynamic random access memory (DRAM), a SRAM, a mobile DRAM, etc. The storage device 830 may include a nonvolatile memory device, such as an erasable programmable read-only memory (EPROM), an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc. In example embodiments, the storage device 830 may further include a solid state drive (SSD), a hard disk drive (HDD), a CD-ROM, etc.

The modules 840, 850, 860 and 870 may perform various functions of the mobile device 800. For example, the mobile device 800 may include the communication module 840 that performs a communication function (e.g., a code division multiple access (CDMA) module, a long term evolution (LTE) module, a radio frequency (RF) module, an ultra-wideband (UWB) module, a wireless local area network (WLAN) module, a worldwide interoperability for a microwave access (WIMAX) module, etc.), the camera module 850 that performs a camera function, the display module 860 that performs a display function, the touch panel module 870 that performs a touch sensing function, etc. In example embodiments, the mobile device 800 may further include a global positioning system (GPS) module, a microphone (MIC) module, a speaker module, a gyroscope module, etc.

Figure 18:
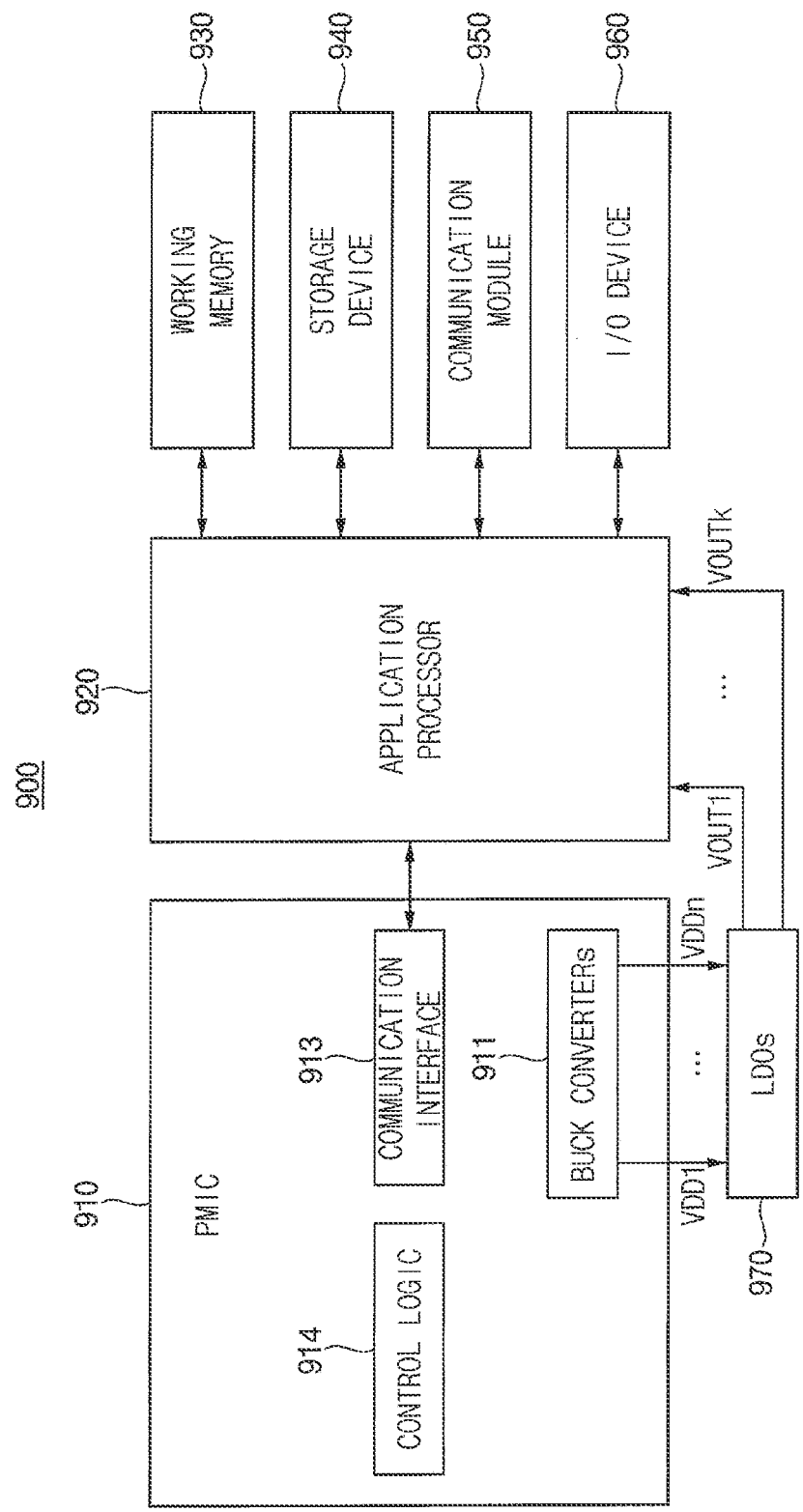
FIG. 18 is a block diagram illustrating a mobile device according to embodiments of the inventive concept.

FIG. 18 is a block diagram illustrating a mobile device 900 according to embodiments of the inventive concept.

Referring to FIG. 18, the mobile device 900 may be implemented as an electronic device capable of using or supporting an interface protocol proposed by the mobile industry processor interface (MIPI) alliance. The mobile device 900 may include an application processor 920, a working memory 930, a storage device 940, a communication module 950, an I/O device 960, a PMIC 910 and LDO regulators 970.

The application processor 920 may control the components 910, 930, 940, 950, 960 and 970.

The working memory 930 may temporarily store data processed or to be processed by the application processor 920. The storage device 940 may semi-permanently store data processed or to be processed by the application processor 920.

The communication module 950 may communicate with an external device using one or more communication protocols, such as world interoperability for microwave access (Wimax), wireless local area network (WLAN), ultra wideband (UWB), long term evolution (LTE), global system for mobile communications (GSM), code division multiple access (CDMA), Bluetooth, near field communication (NFC), wireless fidelity (Wi-Fi), radio frequency identification (RFID), communication control protocol/Internet protocol (TCP/IP), USB, SCSI, mobile PCIe (M-PCIe), and Firewire. The I/O device 960 may include a keyboard, a mouse, a key pad, a button, a touch panel, a touchscreen, a touch pad, a touch ball, a microphone, a gyroscope sensor, a vibration sensor, a liquid crystal display (LCD) device, a light-emitting diode(LED) display device, an organic LED (OLED) display device, an active matrix OLED (AMO-LED) display device, a speaker, a motor, an image sensor, a depth sensor, a camera, a display, an antenna, and so on.

The PMIC 910 may include buck converters 911, a communication interface 913 and a control logic 914. Each of the buck converters 911 may generate respective one of power supply voltages VDD1 to VDDn in response to a battery voltage, and the buck converters 911 may provide the power supply voltages VDD1 to VDDn to the LDO regulators 970.

The LDO regulators 970 may generate output voltages VOUT1 to VOUTk in response to the power supply voltages VDD1 to VDD and may provide the output voltages VOUT1 to VOUTk to the components 920, 930, 940, 950 and 960. The control logic 914 may control the buck converters 911 in response to the DVFS performed by the application processor 920. The communication interface 913 may communicate with the application processor 920.

As described in relation to FIGS. 1 and 4, the PMIC 910 may be mounted on a second side of a PCB and the application processor 920 and the LDO regulators 970 may be mounted on a first side and a second side of a package substrate, respectively, which is mounted on a first side of the PCB. Therefore, the mobile device 900 may reduce the length of power rails and a number of power balls used to transfer the output voltages VOUT1 to VOUT to power domains of the application processor 920.

Various embodiments of the inventive concept may be applied to a PMIC, an SoC, and various devices and systems including the PMIC and the SoC, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, a wearable device, an IoT device, an IoE device, an e-book, a VR device, an AR device, a robotic device, etc.

While the inventive concept has been particularly shown and described with reference to the certain illustrated embodiments, it will be understood by those of ordinary skill in the art that various changes in form and detail may be made therein without departing from the scope of the inventive concept as defined by the following claims.

What is claimed is:

1. A mobile device comprising:
a printed circuit board (PCB) including a first side and an opposing second side;
at least one power management integrated circuit (PMIC) mounted on the second side of the PCB, wherein the PMIC is configured to generate power supply voltages in response to a battery voltage;
a package substrate mounted on the first side of the PCB using first interconnects, wherein the package substrate includes a first side and an opposing second side;
an integrated circuit (IC) mounted on the first side of the package substrate; and
low drop-out (LDO) regulators mounted on the second side of the package substrate between the first interconnects,
wherein the PCB includes first electrical paths connecting the at least one PMIC to the LDO regulators, and
the package substrate includes second electrical paths connecting the LDO regulators to the IC.

2. The mobile device of claim 1, wherein the IC includes at least one of a microprocessor, a graphics processor, a signal processor, a network processor, a chipset, an application processor, a modem IC, a radio frequency (RF) IC, flash memory and a System on Chip (SoC).

3. The mobile device of claim 1, further comprising:
passive components mounted on the first side of the PCB.

4. The mobile device of claim 3, wherein the at least one PMIC includes DC-DC converters respectively configured to generate the power supply voltages in response to the battery voltage; and
the passive components include a capacitor and an inductor associated with at least one of the DC-DC converters.

5. The mobile device of claim 1, wherein the at least one PMIC is mounted on the second side of the PCB using second interconnects.

6. The mobile device of claim 5, wherein the first electrical paths are connected to at least one the second interconnects and at least one of the first interconnects.

7. The mobile device of claim 6, wherein the IC is mounted on the first side of the package substrate using third interconnects,
the second electrical paths include a first branch path connecting at least one of the first interconnects and at least one of the LDO regulators, and a second branch path connecting at least one of the LDO regulators and at least one of the third interconnects.

8. The mobile device of claim 1, further comprising:
high density capacitors respectively disposed between each of the LDO regulators and the second side of the package substrate.

9. The mobile device of claim 8, wherein:
the LDO regulators are configured to generate output voltages in response to the power supply voltages and provide the output voltages to the IC through at least one of the second electrical paths; and
each of the high density capacitors operates as an output capacitor for each of the LDO regulators.

10. The mobile device of claim 9, wherein each of the LDO regulators and a corresponding one of the high density capacitors are fabricated using a same process.

11. The mobile device of claim 9, wherein each of the high density capacitors is stacked on a corresponding one of the LDO regulators.

12. The mobile device of claim 1, wherein the at least one PMIC includes a first PMIC and a second PMIC spaced apart on the second side of the PCB;
the IC is divided into power domains; and
each of the LDO regulators is configured to provide a corresponding output voltage to respective one of the power domains through a ball.

13. The mobile device of claim 12, wherein the first PMIC includes a first group DC-DC converters that generates a first power supply voltage in response to the battery voltage, and
the second PMIC includes a second group DC-DC converters that generate a second power supply voltage, different from the first power supply voltage, in response to the battery voltage.

14. The mobile device of claim 13, wherein each of the first group DC-DC converters and each of the second group DC-DC converters is a buck converter.

15. The mobile device of claim 13, wherein the first group DC-DC converters provides the first power supply voltage to at least one of the LDO regulators through first passive components mounted on the first side of the PCB and at least one of the first electrical paths, and
the second group DC-DC converters provides the second power supply voltage to at least another one of the LDO regulators through second passive components mounted on the first side of the PCB and at least one of the first electrical paths.

16. The mobile device of claim 15, wherein the first passive components include a first capacitor and a first inductor associated with an output of the first group DC-DC converters; and
the second passive components include a second capacitor and a second inductor associated with an output of the second group DC-DC converters.

17. The mobile device of claim 1, further comprising:
a memory mounted on the first side of the package substrate, wherein the memory overlays at least a portion of the IC.

18. The mobile device of claim 17, wherein the memory includes at least one of a dynamic random access memory (DRAM) and a NAND flash memory device including a controller.

19. A method of controlling power in a mobile device, the method comprising:
generating power supply voltages using a power management integrated circuit (PMIC), wherein the PMIC is mounted on a second side of a printed circuit board (PCB) including the second side and an opposing first side;
providing the power supply voltages to low drop-out (LDO) regulators mounted on a second side of a package substrate mounted on the first side of the PCB using first interconnects, the package substrate having a first side and the second side opposing the first side, wherein the LDO regulators are disposed between the first interconnects;
generating output voltages in the LDO regulators in response to the power supply voltages; and providing one of the output voltages to a respective one of power domains of an integrated circuit (IC) mounted on the first side of the package substrate using second interconnects.

20. A mobile device comprising:
a printed circuit board (PCB) including a first side and an opposing second side;
a power management integrated circuit (PMIC) mounted on the second side of the PCB, wherein the PMIC generates power supply voltages in response to a battery voltage;
a package substrate mounted on the first side of the PCB using first interconnects, wherein the package substrate includes a first side and an opposing second side;
an integrated circuit (IC) mounted on the first side of the package substrate;
low drop-out (LDO) regulators mounted on the second side of the package substrate, wherein the LDO regulators are disposed between the first interconnects; and
high density capacitors disposed between each of the LDO regulators and the second side of the package substrate,
wherein the PCB includes first electrical paths connecting the PMIC to the LDO regulators, and
the package substrate includes second electrical paths connecting the LDO regulators to the IC.

* * * * *